US005849104A

United States Patent [19]
Mohindra et al.

[11] Patent Number: 5,849,104
[45] Date of Patent: Dec. 15, 1998

[54] METHOD AND APPARATUS FOR CLEANING WAFERS USING MULTIPLE TANKS

[75] Inventors: Raj Mohindra, Los Altos Hills; David C. Wong, San Jose; Suraj Puri, Los Altos, all of Calif.

[73] Assignee: YieldUP International, Mountain View, Calif.

[21] Appl. No.: 710,701

[22] Filed: Sep. 19, 1996

[51] Int. Cl.[6] .................................................. B08B 13/00
[52] U.S. Cl. ...................... 134/25.4; 134/42; 134/102.3; 134/902; 134/201
[58] Field of Search ............................. 134/102.2, 102.3, 134/155, 186, 188, 184, 902, 88, 107, 108, 103, 201, 25.4, 42

[56] References Cited

U.S. PATENT DOCUMENTS

| 4,520,834 | 6/1985 | Dicicco ................................... 134/902 |
| 4,633,893 | 1/1987 | McConnell et al. ...................... 134/902 |
| 4,715,392 | 12/1987 | Abe et al. ............................... 134/902 |
| 4,731,154 | 3/1988 | Hazlitt et al. ........................... 134/902 |

(List continued on next page.)

FOREIGN PATENT DOCUMENTS

| EPO 385 536 | of 0000 | European Pat. Off. . | |
| 41 39 465 | 6/1992 | Germany . | |
| 4139465 | 6/1992 | Germany ............................. 134/902 |
| 62-188323 | 8/1987 | Japan . | |
| 3-124026 | 5/1991 | Japan . | |
| 4-34932 | 2/1992 | Japan .................................... 134/902 |
| 4-79326 | 3/1992 | Japan .................................... 134/902 |
| 4-83340 | 3/1992 | Japan . | |
| 4-192419 | 7/1992 | Japan . | |
| 4-233747 | 8/1992 | Japan .................................... 134/902 |
| 4-239132 | 8/1992 | Japan .................................... 134/902 |
| 4-251930 | 9/1992 | Japan . | |
| 5-13397 | 1/1993 | Japan .................................... 134/902 |
| 5-136116 | 6/1993 | Japan .................................... 134/902 |
| 5-283386 | 10/1993 | Japan . | |
| 5-283391 | 10/1993 | Japan . | |
| 5-326464 | 12/1993 | Japan . | |
| 6-163500 | 6/1994 | Japan . | |
| 6-177107 | 6/1994 | Japan . | |
| 6-196401 | 7/1994 | Japan . | |
| 6-63501 | 10/1994 | Japan . | |

OTHER PUBLICATIONS

K. Wolke, B. Eitel, M. Schenkl, S. Rummelin, and R. Schild, "Marangoni Drying for Hydrophilic and Hydrophobic Wafers", Semiconductor Fabtech, pp. 215–218.

"Marangoni Dryer –The Revolutionary Super Clean and Cost Effective Alternative", Brochure, 3 pages.

CFM Technolgoies, Inc. Vapor–flow IPA Rinser–Dryer, "The IPA Rinser–Dryer with Advanced Particle Remover", Brochure, 7 pages.

D. J. Riley and R. G. Carbonell, "The Deposition of Contaminants from Deionized Water onto Hydrophobic Silicon Wafers", Journal of the IES, pp. 28–34, Nov./Dec. 1991.

(List continued on next page.)

*Primary Examiner*—Frankie L. Stinson
*Attorney, Agent, or Firm*—Townsend and Townsend and Crew LLP

[57] ABSTRACT

A cleaning system (1, 5) having multiple cleaning chambers (200) is provided. Each cleaning chamber (200) includes an interior region sufficient for immersing a carrier (242), which has at least one wafer disposed therein, into an ultra-clean liquid. The cleaning chamber (200) also has an inlet operably coupled to the interior region to introduce a gas into the interior region and a drain operably coupled to the interior region to remove the ultra-clean liquid from the interior region at a selected rate. A controller 14 is operably coupled to the chamber (200) for selectively controlling the selected rate. In an alternative embodiment, an installation technique (80) for the above cleaning system (1, 5) is provided.

39 Claims, 10 Drawing Sheets

U.S. PATENT DOCUMENTS

| | | | |
|---|---|---|---|
| 4,750,505 | 6/1988 | Inuta et al. | 134/153 |
| 4,778,532 | 10/1988 | McConnell et al. | 134/10 |
| 4,871,417 | 10/1989 | Nishiawa et al. | 156/640 |
| 4,874,014 | 10/1989 | Grant et al. | 137/606 |
| 4,881,561 | 11/1989 | Schwarzwalder | 134/184 |
| 4,911,761 | 3/1990 | McConnell et al. | 134/11 |
| 4,917,123 | 4/1990 | McConnell et al. | 134/95 |
| 4,984,597 | 1/1991 | McConnell et al. | 134/902 |
| 4,987,687 | 1/1991 | Sugimoto | 34/58 |
| 5,082,518 | 1/1992 | Molinaro | 156/345 |
| 5,107,880 | 4/1992 | Pierson | 134/902 |
| 5,129,955 | 7/1992 | Tanaka | 134/2 |
| 5,143,103 | 9/1992 | Basso et al. | 134/98.1 |
| 5,156,174 | 10/1992 | Thompson et al. | 134/153 |
| 5,169,408 | 12/1992 | Biggerstaff et al. | 29/25.01 |
| 5,186,192 | 2/1993 | Netsu et al. | 134/199 |
| 5,190,064 | 3/1993 | Aigo | 134/902 |
| 5,228,206 | 7/1993 | Grant et al. | 34/1 |
| 5,286,657 | 2/1994 | Bran | 437/9 |
| 5,301,701 | 4/1994 | Nafziger | 134/95.2 |
| 5,315,766 | 5/1994 | Roberson, Jr. et al. | 34/409 |
| 5,339,843 | 8/1994 | Benedict et al. | 134/186 |
| 5,421,905 | 6/1995 | Ueno et al. | 134/25.4 |
| 5,520,744 | 5/1996 | Fujikawa et al. | 134/102.3 |
| 5,569,330 | 10/1996 | Schild et al. | 134/902 |

OTHER PUBLICATIONS

N. D. Casper and B. W. Soren, "Semiconductor Yield Enhancement Through Particle Control", Emerging Semiconductor Technology, pp. 423–435.

M. Itano, F. W. Kern, Jr., R. W. Rosenberg, M. Miyashita, I. Kawanabe and T. Ohmi, "Particle Deposition and Removal in Wet Cleaning Processes for ULSI Manufacturing", IEEE Trans. on Semiconductor Manufacturing, vol. 5, No. 2, pp. 114–120, May 1992.

Y. Yagi, T. Imaoka, Y. Kasama, and T. Ohmi, "Advanced Ultrapure Water Systems with Low Dissolved Oxygen for Native Oxide Free Wafer Processing", IEEE Trans. On Semiconductor Manufacturing, vol. 5, No. 2, pp. 121–127, May 1992.

H. G. Parks, J. F. O'Hanlon, and F. Shadman, "Research Accomplishments at the University of Arizona Sematech Center of Excellence for Contamination Defect Assessment and Control", IEEE Trans. on Semiconductor Manufacturing, vol. 6, No. 2, pp. 134–142, May 1993.

C. S. Ackerman and J. M. Fabia, "Monitoring Supplier Quality at PPM Levels", IEEE Trans. on Semiconductor Manufacturing, vol. 6, No. 2, pp. 189–194, May 1993.

G. D. Moss, J. N. DiBello, K. O. Yandes, and R. F. Orr, "Capillary Drying: Particle–Free Wet–Process Drying?".

T. Ohmi, Ultra Clean Technology Handbook, p. 290, 1993.

J. Marra, "Ultra Clean Marangoni Drying", pp. 269–282.

C. McConnell, "Examining the Effects of Wafer Surface Chemistry on Particle Removal Using Direct–Displacement Isopropyl Alcohol Drying", MicroContamination, Feb. 1991.

P. Burggraaf, "Keeping the 'RCA' in Wet Chemistry Cleaning", Semiconductor International, pp. 86–90, Jun. 1994.

M. B. Olesen, "A Comparaitve Evaluation of the Spin Rinse/Dryer with the IPA Vapor Isodry Technique", Proceedings –Institute of Environmental Sciences, pp. 229–241, 1990.

METHOD AND APPARATUS FOR CLEANING WAFERS USING MULTIPLE TANKS

CROSS-REFERENCE TO RELATED APPLICATIONS

This application is related to U.S. application Ser. No. 08/555,634, filed Nov. 8, 1995, now U.S. Pat. No. 5,772,784, which is a continuation-in-part of application Ser. No. 08/437,541, filed May 9, 1995, now U.S. Pat. No. 5,571,537, which is a continuation-in-part of application Ser. No. 08/339,326, filed Nov. 14, 1994, now U.S. Pat. No. 5,634,978, all in the name of the present assignee, and all hereby incorporated by reference for all purposes.

BACKGROUND OF THE INVENTION

The present invention relates to the field of semiconductor integrated circuits. The invention is illustrated in an example with regard to a semiconductor integrated circuit cleaning technique using a multi-tank cleaning apparatus, but it will be recognized that the invention has a wider range of applicability. Merely by way of example, the invention can also be applied to the manufacture of raw wafers, lead frames, medical devices, disks and heads, flat panel displays, microelectronic masks, and other applications requiring high purity wet processing such as steps of rinsing, cleaning, drying, and the like.

In the manufacture of semiconductor integrated circuits, the efficient use of the fabrication facility is important. In particular, fabrication facilities are a limited resource, which can cost hundreds of millions of U.S. dollars to build. Once the fabrication facility is built, it is often difficult to upgrade such facility for the purpose of adding more floor space or the like. Most commonly, another fabrication facility is built in order to add floor space for additional capacity or an additional process. The process of building these fabrication facilities is often time consuming, difficult, and costly.

Additionally, as devices become more complicated, equipment used for the manufacture of these devices also becomes further complicated. Typically, equipment used in the fabrication of wafers becomes more expensive with each new generation. In addition, as the complexity of this equipment increases, so does its size. This larger sized equipment often occupies a larger footprint on the fabrication floor facility, which is an expensive and a limited resource. The use of larger equipment increases the cost of using such equipment further.

Furthermore, as these devices become more complicated, wafers generally become larger. These larger wafers must use larger wafer boats. The larger wafer boats can often only be used in larger processing equipment. Larger processing equipment occupies a greater floor space in the fabrication facility. The larger sized equipment requires a larger facility, which further adds to the total cost of manufacturing an integrated circuit.

Semiconductor integrated circuit fabrication equipment which generally increased in size with each successive generation includes many commonly used rinsing and drying systems. In particular, a conventional spin rinse/dryer increased in size to accommodate larger wafers. That is, six inch wafers generally do not fit inside the chamber of a spin rinse/dryer apparatus designed for four inch wafers or the like.

In conventional existing fabrication facilities, the spin/rinse dryer must often be replaced frequently to maintain low particle counts and low equipment failure rates. In particular, the spin rinse/dryer has an extremely complex mechanical design with numerous moving parts. The complex mechanical design often leads to certain problems such as greater downtime, wafer breakage, more spare parts, greater costs, among others. A further limitation is static electricity often builds up on the wafers during the spin cycle, thereby attracting numerous particles onto the surface of the semiconductor.

Some tens of thousands spin/rinse dryers are being used in the conventional fabrication facilities world-wide. Most of these spin/rinse dryers should be replaced in the next few years. These spin/rinse dryers, however, generally occupy a relatively smaller footprint than other types of drying systems. This means that spin/rinse dryers are generally replaced by another conventional spin/rinse dryer, which would probably need replacement within a few years after being introduced into the fabrication facility. There are simply no good alternatives to replace these spin/rinse dryers. Accordingly, a variety of potential problems occur, even after introducing a new spin/rinse dryer, which still has a variety of limitations. U.S. application Ser. No. 08/555,634 describes many of these limitations.

Other techniques used to dry wafers include an isopropyl alcohol (IPA) vapor dryer, full displacement IPA dryer, and others. These IPA-type dryers often rely upon a large quantity of a solvent such as isopropyl alcohol and other volatile organic liquids to facilitate drying of the semiconductor wafer. An example of such a technique is described in U.S. Pat. No. 4,911,761, and its related applications, in the name of McConnell et al. and assigned to CFM Technologies, Inc. McConnell et al. generally describes the use of a superheated or saturated drying vapor as a drying fluid. This superheated or saturated drying vapor often requires the use of large quantities of a hot volatile organic material. The superheated or saturated drying vapor forms a thick organic vapor layer overlying the rinse water to displace (e.g., plug flow) such rinse water with the drying vapor. The thick organic vapor layer forms an azeotropic mixture with water, which will condense on wafer surfaces, and then evaporates to dry the wafer.

A limitation with this type of dryer is its use of the large solvent quantity, which is hot, highly flammable, and extremely hazardous to health and the environment. In fact, this dryer needs a "small chemical plant" including a vaporizer and a condenser to handle the large quantities of hot volatile organic material. This dryer including its small chemical plant is often massive in size and requires a large floor space in the fabrication facility. As wafer size increases, so does the size of the IPA dryer, which occupies even a larger floor space for handling larger wafers. Though not used as commonly as spin/rinse dryers, the IPA dryers cannot be used to replace the spin/rinse dryers due to their massive size. That is, an IPA dryer cannot be placed on the same floor space that was previously occupied by a conventional spin/rinse dryer.

Still other techniques such as the quick-dump, the cascade rinse, the hot deionized (DI) water process and the like also suffer from similar limitations. In addition, these techniques generally rely upon tanks, which are increased in size to hold larger wafers. These larger tanks often include more processing fluids, which must be replenished repeatedly. Larger tanks also occupy a larger floor space in the fabrication facility. These techniques also require separate rinse and drying stations, which occupy even more floor space. Additional limitations of these techniques are described in detail in U.S. application Ser. No. 08/555,634 , noted above.

A pioneering approach that was developed to effectively clean and dry semiconductor wafers is a motionless drying technique using ultra-clean fluids described in U.S. Pat. No. 5,571,337 in the names of Mohindra, et al. and assigned to the present assignee, YieldUP International. This technique generally cleans and dries semiconductor wafers using ultra-clean fluids in an apparatus which allows the wafer to be substantially motionless during processing. It would be desirable, however, to provide this technique using a smaller footprint and higher capacity for processing large runs of integrated circuits and the like.

From the above, it is seen that a cleaning method and apparatus for semiconductor integrated circuits that is safe, easy, reliable, and occupies a relatively small footprint is often desired.

SUMMARY OF THE INVENTION

The present invention provides a safe, efficient, and economical method and apparatus to clean and dry an article such as a semiconductor wafer. This invention provides an apparatus using at least two cleaning chambers positioned adjacent to each other for cleaning semiconductor wafers and the like.

In a specific embodiment, the present invention provides an apparatus for cleaning large batches of semiconductor wafers in a relatively motionless manner. The apparatus includes a housing having a width portion no greater than about thirty-six inches and a length portion no greater than about seventy-two inches, which provide a relatively small footprint for replacing other equipment or for installing into the fabrication facility. The housing comprises a plurality of cleaning chambers, at least two of the plurality of chambers being positioned next to each other so that a width of the two chambers is less than about thirty-six inches to fit into the similarly sized housing. Each chamber includes an interior region sufficient for immersing a carrier having wafers therein into an ultra-clean liquid. The chamber also includes an inlet operably coupled to the interior region to introduce a gas into the interior region, and a drain operably coupled to the interior region to remove the ultra-clean liquid from the interior region at a selected rate. A controller is also operably coupled to the chamber for controlling the selected rate.

In an alternative specific embodiment, the invention provides a method for installing a cleaning apparatus, which allows for the replacement of a pre-existing drying system. The installation method provides a fabrication floor having a used drying unit, which is operably coupled to power and a plurality of fluid lines such as a nitrogen line, a deionized (DI) water line, a drain line, and others. In most cases, the drying unit occupies a floor space no greater than about thirty-six inches by seventy-two inches. The method then removes the used drying unit from the fabrication floor by disconnecting the power and the plurality of fluid lines, and installs a cleaning apparatus onto the floor space no greater than about thirty-six inches by about seventy-two inches. The installing step includes connecting the power and the plurality of fluid lines to the cleaning apparatus. The cleaning apparatus has a housing having a width portion no greater than about thirty-six inches and a length portion no greater than about seventy-two inches. The housing includes a plurality of cleaning chambers, whereupon at least two of the plurality of chambers being positioned next to each other so that a width of the two chambers is less than about thirty-six inches, or thirty inches, or twenty-four inches, or twenty inches, or eighteen inches. Each cleaning chamber is similar to those described in the previous embodiment.

A variety of benefits are achieved using the present invention. More particularly, the benefits include high capacity operation, which can both rinse and dry a semiconductor wafer or the like. High capacity operation is achieved using a multiple tank unit, where each tank can process up to a carrier of wafers, e.g., twenty five wafers. In addition, each tank has a relatively small volume for processing wafers, thereby using less chemicals than a larger conventional tank system. The invention can also be used to replace pre-existing spin rinse/dryers, which generally have a relatively small footprint. This allows a user to replace conventional spin rinse/dryers with a cleaning system that should actually improve yields by removing or reducing particulate contamination, wafer breakage, and the like. The replacement procedure also uses pre-existing facilities such as nitrogen lines, drain lines, water lines, and the like. Accordingly, the replacement process is relatively easy and cost effective in most cases. Moreover, equipment downtime or maintenance time is reduced using the present multiple tank system. In particular, one tank can be placed down for maintenance while the other tank is still operating, thereby providing continuous processing capability.

A further understanding of the nature and advantages of the present invention may be realized by reference to the latter portions of the specification and attached drawings.

DESCRIPTION OF THE SPECIFIC EMBODIMENT

Figure 1:
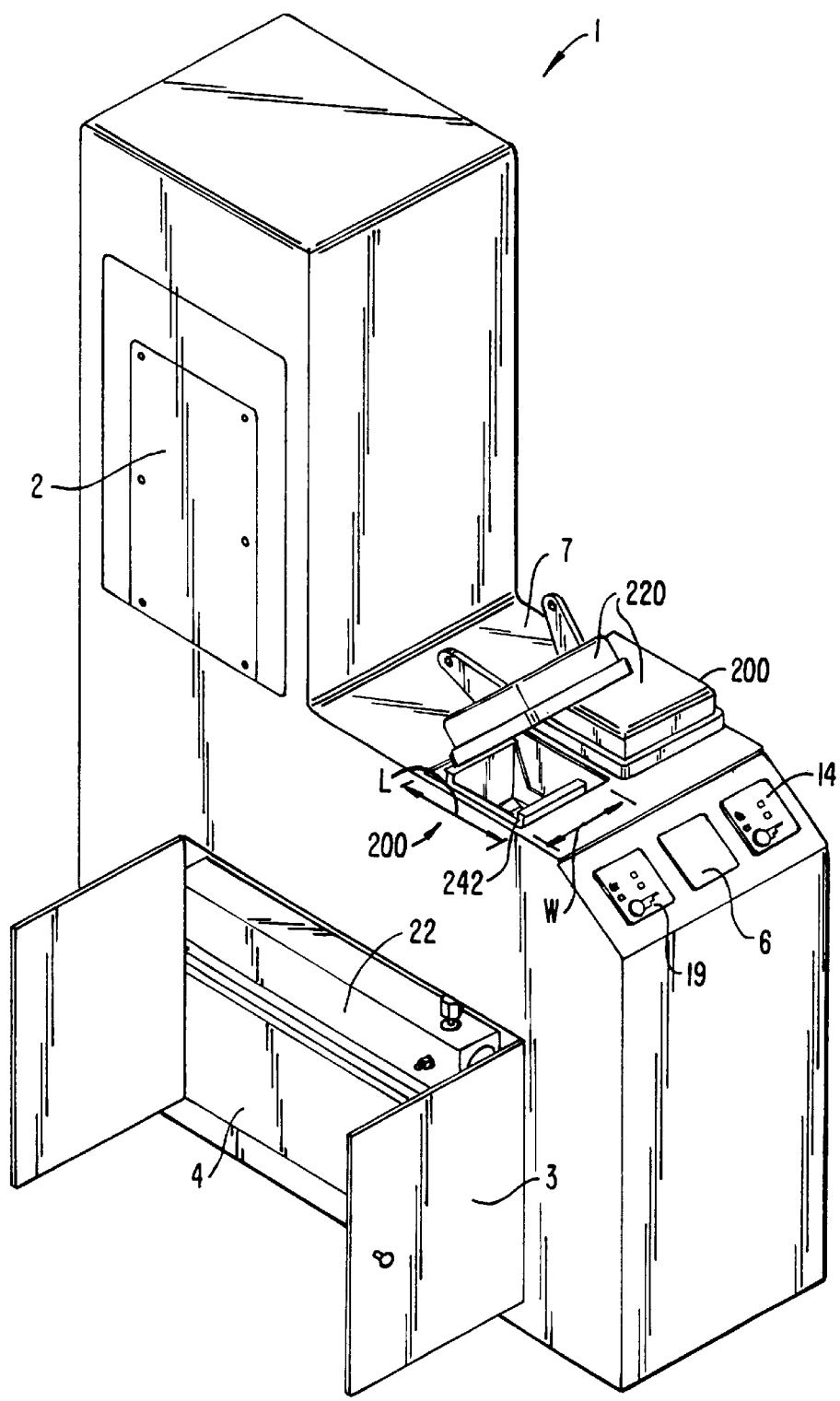
FIG. 1 is simplified diagram of a cleaning system according to the present invention.

FIG. 1 is a simplified diagram of a cleaning system 1 according to the present invention. This diagram is merely an illustration and should not limit the scope of the claims herein. The cleaning system 1 includes hardware and software elements. The hardware elements include a housing 7, which is made of a durable chemical resistant material. This material should be relatively easy to work with and also provide suitable structural support. An example of this material can include a polypropylene material, a product sold under the trademark TEFLON™, and others.

Figure 1A:
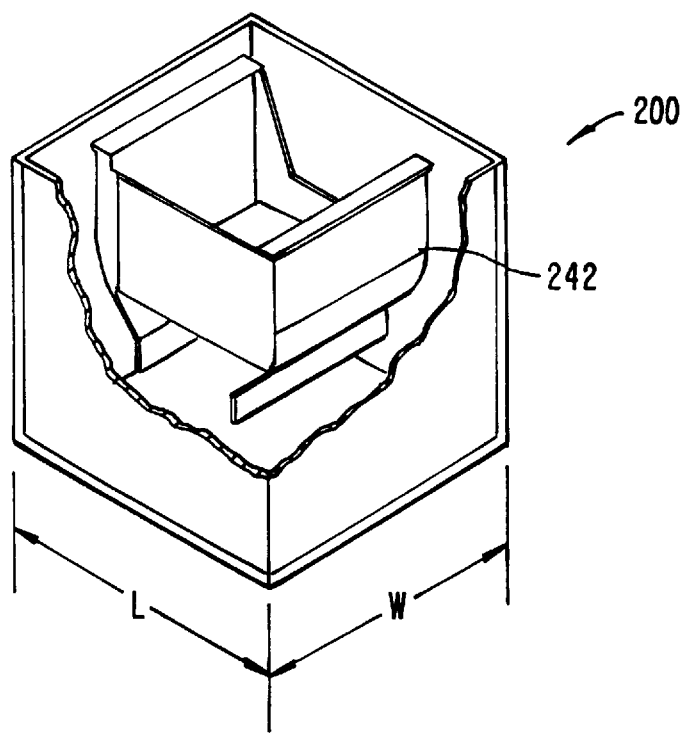
FIG. 1A is a simplified diagram of a cleaning chamber according to the present invention.

The housing includes a plurality of cleaning chambers 200, each having a lid 220. The cleaning chambers 200 are positioned close to each other and preferably adjacent to each other as shown. In a specific embodiment, each cleaning chamber 200 is designed to hold at least one conventional carrier or wafer boat 242 of six inch wafers as further illustrated by FIG. 1A. The conventional boat 242 of wafers includes a maximum of twenty-five wafers, and has a width of about seven inches and a length of about five and one-half inches. The wafer boat 242 is positioned into the cleaning chamber where the wafers are perpendicular to the width of the housing. This allows at least two wafer boats 242 to be positioned within an eighteen-inch width floor space, which is being occupied by the housing width.

For these six-inch wafers, the cleaning chamber typically includes a width (W) of about eight inches or less and a length (L) of about nine inches or less. This allows two chambers to sit side-by-side, thereby allowing for up to fifty wafers to be processed at one time, where up to twenty-five wafers are processed in each chamber. Each chamber also has a volume of about two gallons or more for efficient processing. In numerous fabrication facilities, it is highly desirable to have a run of fifty wafers to improve device turn-around-time and efficiency. Other than six-inch wafers, the cleaning chamber can hold five-inch, four-inch, three-inch, two-inch, and one-inch wafers. Alternatively, the cleaning chamber can hold larger wafers such as eight-inch, ten-inch, twelve-inch, and greater, depending upon the application.

The cleaning system also includes a controller 14 for each cleaning chamber 200. Alternatively, a single controller 14 can oversee the operations of both cleaning chambers. The cleaning system 1 includes a keypad 6 for providing user input to the controllers 14. An electrical box 2 is located in an upper portion of the housing 7. Also included is a heater 22, a gas manifold box 4, and other elements.

Figure 2:
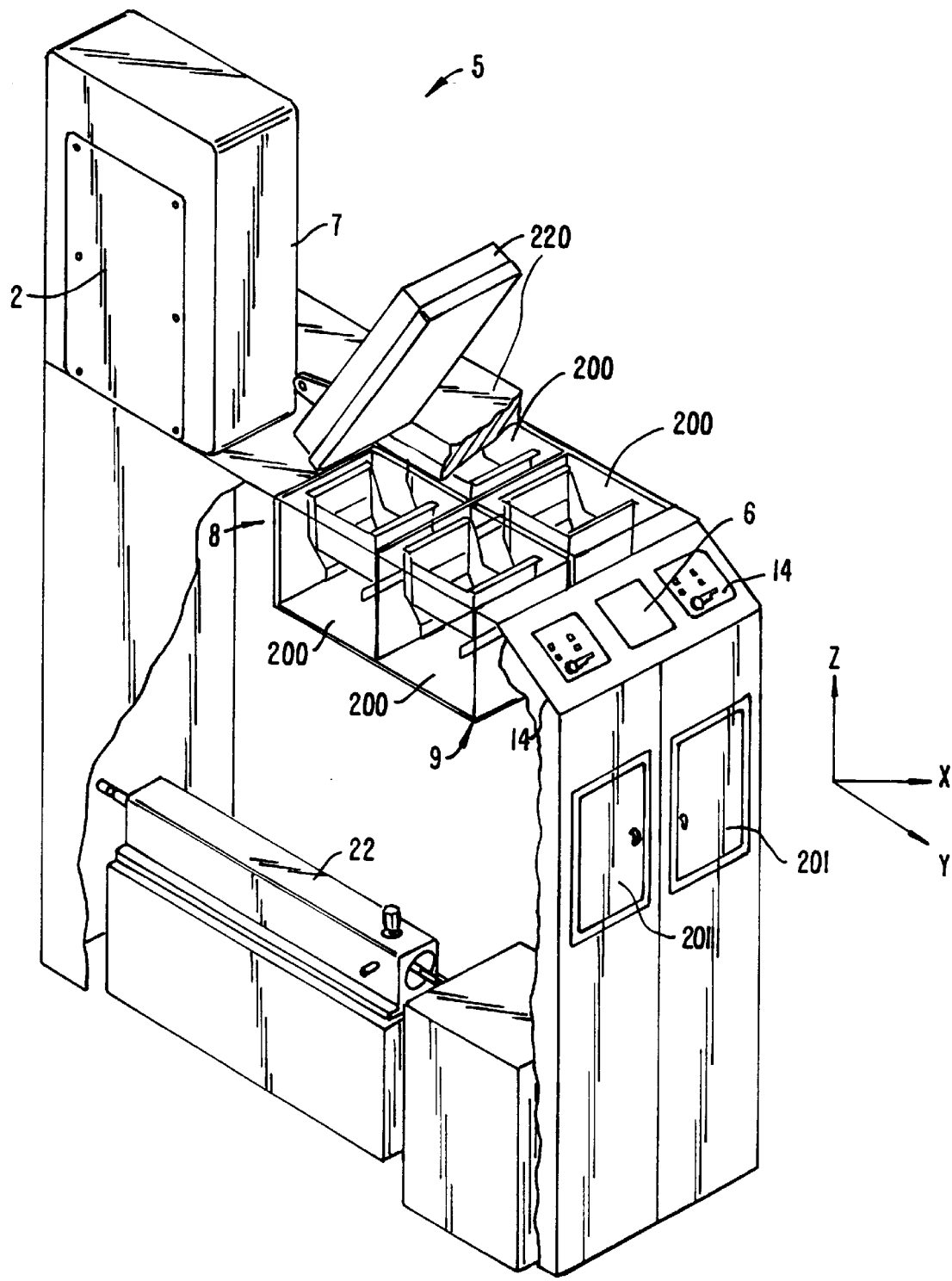
FIG. 2 is a simplified diagram of a cleaning system according to an alternative embodiment of the present invention.

FIG. 2 is a simplified diagram of a cleaning system 5 according to an alternative embodiment of the present invention. This diagram is merely an illustration and should not limit the scope of the claims herein. The cleaning system 5 includes similar hardware and software as the previous system. This cleaning system, however, comprises more than two cleaning chambers 200.

The cleaning system includes at least four cleaning chambers 200. The cleaning system has a plurality of controllers 14, a keypad 6, a heater 22, an electrical box 2, and other elements. As shown, the cleaning system 5 has a plurality of chambers including a first set of chambers 8 and a second set of chambers 9, each having two chambers.

The first two chambers 8 are configured in a manner similar to the above embodiment. Two other chambers 9 are configured in back of or behind the first two chambers 8 as shown. This allows up to twenty-five wafers to be processed per chamber, or batch. Since there are four chambers, up to one hundred wafers can be processed using this cleaning system.

Preferably, each chamber includes a width of about eight inches or less and a length of about nine inches or less. This allows two chambers to sit side-by-side, thereby allowing for up to fifty wafers to be processed at one time in the first two chambers, where up to twenty-five wafers are processed in each chamber. Since two sets of chambers are available, one hundred wafers or four wafer boats can be processed together. Each chamber also has a volume of about two gallons or more for efficient processing. In numerous fabrication facilities, it is highly desirable to have a run of fifty wafers (or two wafer boats) or more preferably one hundred wafers (or four wafer boats) to improve device turn-around-time and efficiency.

In one embodiment, each cleaning chamber has its own controller. Alternatively, a single controller can oversee all of the cleaning chambers. This will allow flexibility in configuring the cleaning chambers.

In still further embodiments, the cleaning system includes a third set of cleaning chambers 201, positioned below the first and second sets of cleaning chambers 200. The third set of cleaning chambers 201 includes an openable front door, which provides an opening for providing a cassette of wafers therein. The door is preferably sealable. A controller can be coupled to each of the chambers in this third set, thereby allowing for independent operation. In the above embodiments, the housing and the cleaning chambers were configured to occupy a relatively small footprint. The housing and the cleaning chambers can also be configured to occupy a footprint of less than about thirty-six inches by seventy-two inches, or less than about thirty inches by seventy-two inches, or less than about twenty-four inches by seventy-two inches, or less than about twenty inches by about seventy-two inches. Preferably, the configuration allows the present cleaning system to replace a typical used drying unit such as a spin/rinse dryer or the like. Further details of above cleaning systems are described by way of the descriptions and Figs. below.

Figure 3:
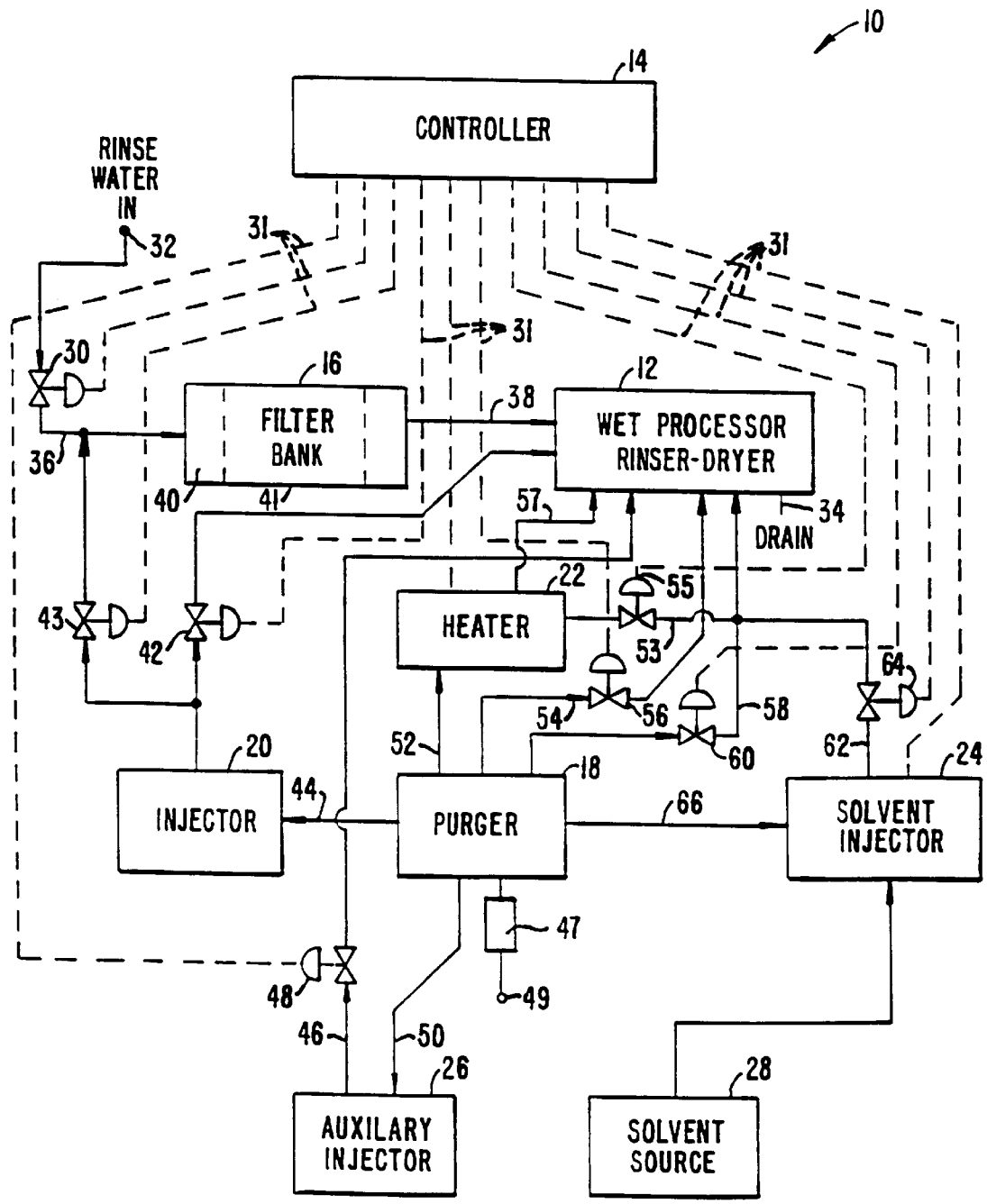
FIG. 3 is a simplified block diagram of the cleaning systems of the above Figs. according to the present invention.

FIG. 3 is a simplified block diagram 10 of the cleaning systems of the above Figs. according to the present invention. The cleaning system 10 includes elements such as a wet processor 12, a controller 14, a filter bank 16, a purger 18, an injector 20, a heater 22, a solvent bubbler 24, an auxiliary injector 26, and a solvent source 28. The system also includes a plurality of flow control valves 30. Each of the flow control valves is operably coupled to the controller 14 and at least one of the aforementioned elements, as shown by dashed lines 31. The solid lines represent lines used to transfer fluids between each of the system elements. A rinse water source 32 and drain 34 are also shown. Many of these elements are designed inside the housing 7 of the cleaning systems.

Rinse water enters the system at the rinse water source 32. A control valve at the rinse water source 32 controls the flow of rinse water via the controller 14, operably coupled to the control valve 30. The rinse water is a filtered liquid such as deionized (DI) water, among others. Typically the DI water originates from a DI water pad, often outside a wafer fabrication plant.

The filter bank can be any suitable combination of filters, typically used for point of use applications. The filter bank connects to the rinse water source through a line 36 and connects to the wet processor through a line 38. The filter bank includes an ion exchange module 40, a combination of charged and neutral filters 41, among others. This filter bank provides point of use ultra-purified water. The ultra-purified water is substantially free from particles greater than about 0.5 microns, and preferably greater than about 0.2 microns, and more preferably greater than about 0.1 microns.

Examples of charged filters are described and illustrated in application Ser. No. 08/285,316, filed Aug. 3, 1994, now U.S. Pat. No. 5,542,441, entitled METHOD AND APPARATUS FOR DELIVERING ULTRA-LOW PARTICLE COUNTS IN SEMICONDUCTOR MANUFACTURING (hereinafter "ULTRA-LOW PARTICLE COUNTS") assigned to the present assignee, and hereby incorporated by reference for all purposes. The filter bank provides for ultra-purified DI water with particles no greater than 0.5 microns in diameter, and preferably 0.2 microns in diameter and less and more preferably 0.1 microns in diameter and less.

The filter bank also provides for a nominal pressure drop therethrough. The pressure drop is less than about 15 pounds per square inch, and preferably less than about 5 pounds per square inch.

A higher flow rate is achieved through the filter bank without auxiliary pumps or flow/pressure enhancing devices. Of course, other filters capable of providing ultra-purified water for point of use applications can be used depending upon the application.

The injector 20 can be any suitable injector for reducing or preferably eliminating metal contaminants from lines and system elements. Preferably, the injector 20 is a hydrochloric acid injector. An example of an injector is discussed in ULTRA-LOW PARTICLE COUNTS. The injector connects to the wet processor 12. A control valve 42 meters the acid into the wet processor 12, and a control valve 43 meters the acid into the filter bank 16. Preferably, the controller 14 meters such acid into the system elements such as the wet processor 12 and the filter bank 16, among others during system maintenance, and other desirable times. The injector also connects via line 44 to the purger 18. The purger provides clean pressurized gas to the injector to allow such acid to be introduced into the aforementioned system elements without other auxiliary devices. Of course, the type of injector used depends upon the particular application.

A use of another chemical such as a solvent, hydrogen peroxide, surfactant, cleaning solution, or the like is optionally introduced through the auxiliary injector 26. The auxiliary injector connects to the wet processor through a line 46, and is controlled by a control valve 48 operably coupled to the controller 14. A purger supplying pressurized gas also connects to the auxiliary injector 26 through a line 50. An example of an auxiliary injector and its operation is also illustrated in the ULTRA-LOW PARTICLE COUNTS. Of course, the type of auxiliary injector used depends upon the particular application.

A further system element is the purger 18, often used to supply gas and/or a pressure head to certain system elements such as the wet processor and others. The purger can be any suitable type of pressure reduction and/or control means capable of supplying the source gas to certain system elements at the desired pressure and flow rate. The purger connects to a source gas 49, which is often a carrier gas used in the cleaning system.

Purger 49 also couples to filter 47 before the gas source. This filter 47 is capable of high flow rates, e.g., 1500 standard liters/minute and greater. Filter 47 also has a retention rating at 0.003 microns. Preferably, no less than about 99.9999999% of particles are removed by way of filter 47. The filter 47 is coupled between the facilities and cleaning system 10. The filter 47 is located before or immediately before the cleaning system 10. In one embodiment, the filter 47 is attached to the cleaning system, but also can be at other locations. This filter provides for a substantially particle free environment. That is, the gas is substantially free from particles greater than about 0.2 microns, or greater than about 0.1 microns, or greater than about 0.05 microns, or greater than about 0.025 microns, or more preferably greater than about 0.01 microns and less.

An example of such a filter is product made by Wafergard T-Line Cartridge Filters. Of course, other filters can be used depending upon the application.

Preferably, the carrier gas is an ultra-purified or electronic grade nitrogen gas, or any suitable carrier gas capable of carrying a cleaning enhancement substance (e.g., a trace of polar organic compound, etc.) into the wet processor at a desired temperature, pressure, and flow rate. The suitable carrier gas also includes a high purity level to prevent contamination of the system elements. An example of a purger is illustrated in ULTRA-LOW PARTICLE COUNTS. The carrier gases (or gas) is also ultra-clean or substantially free from particles greater than about 0.1 microns and preferably greater than about 0.05 microns. As previously noted, the purger also supplies pressurized carrier gas to the bubbler 20 and auxiliary injector 26 through lines 44 and 50, respectively. The purger further supplies gas to the wet processor through certain alternative routes.

A typical route connects the purger 18 to the wet processor 12 through the heater 22 via lines 52 and 57. In this route, the gas can be heated at the heater 22 before entering into the wet processor 12 through the line 57. The heater can be any suitable commercially available or custom made heater capable of heating the gas such as nitrogen to a temperature at the wet processor 12 greater than 70°F. and preferably greater than 150°F., but no greater than 200°F. The controller is operably coupled to the heater to adjust the temperature of the gas and turn-on and turn-off the gas at the desired times. Preferably, however, the gas is at room temperature, and is not heated. The controller also meters the gas into the wet processor at a desired flow rate and time.

Alternatively, the heated gas (a carrier gas) connects to the solvent bubbler 24 through a line 53, before entering the wet processor 12. The heated carrier gas mixes and dilutes solvent from the solvent bubbler 24 before entering the wet processor 12. The controller 14 is operably coupled to a control valve 55 to meter the heated carrier gas to the wet processor 12.

Another alternative route connects the purger 18 directly to the wet processor 12 through a line 54. The controller 14 is operably coupled to a control valve 56 to turn-on and turn-off the gas at the desired times. The controller 14 and the control valve 56 also meter the gas into the wet processor 12 at a desired flow rate and time.

In a further alternative route, the purger 18 connects to the solvent bubbler 24 through a line 58 before entering the wet processor 12. In this route, the carrier gas mixes with solvent (a cleaning enhancement substance) from the solvent bubbler 24 before entering the wet processor 12. The controller is operably coupled to a control valve 60 that meters the carrier gas to the wet processor through the line 58. In one embodiment, the carrier gas contains a trace of polar organic solvent. This carrier gas contains a cleaning enhancement substance which increases fluid flow and cleans off objects to be cleaned. Alternatively, other devices can be used to introduce the cleaning enhancement substance into the chamber. These devices include a sonic injector or transducer, which atomizes a liquid into an atomized gas or vapor. The sonic injector operates at frequencies such as ultrasonic, megasonic, and others. Of course, the use of any of these configurations or combinations of such configurations depends upon the particular application.

The controller 14 can be any suitable microprocessor based programmable logic controller, personal computer controller, or the like for process control. A suitable controller includes features such as programmability, reliability, flexibility, and durability from corrosive elements. The suitable controller includes various input/output ports used to provide connections to open and close valves, regulate and meter fluids, among other features. The controller also includes sufficient memory to store process recipes for desired applications. An example of a suitable controller is illustrated in the ULTRA-LOW PARTICLE COUNTS. Of course, the type of controller used depends upon the particular application.

The solvent bubbler 24 supplies a carrier gas comprising a trace amount of polar organic compound (a cleaning enhancement substance) to the wet processor 12 through line 62. Preferably, the cleaning enhancement substance is a trace of solvent. The purger 18 supplies the carrier gas to the solvent bubbler through line 66. To regulate or meter the flow of the solvent into the wet processor, the controller operably couples a control valve 64 connected to the line 66, attached to the solvent bubbler. The system also provides the solvent source 28 such as a bottle or canister of the desired chemical. The solvent bubbler can be any suitable solvent bubbler system for use with the wet processor, carrier gas, and solvent. An example of a solvent bubbler system is described in U.S. application Ser. No. 08/555,634, which was incorporated by reference for all purposes.

Figure 4:
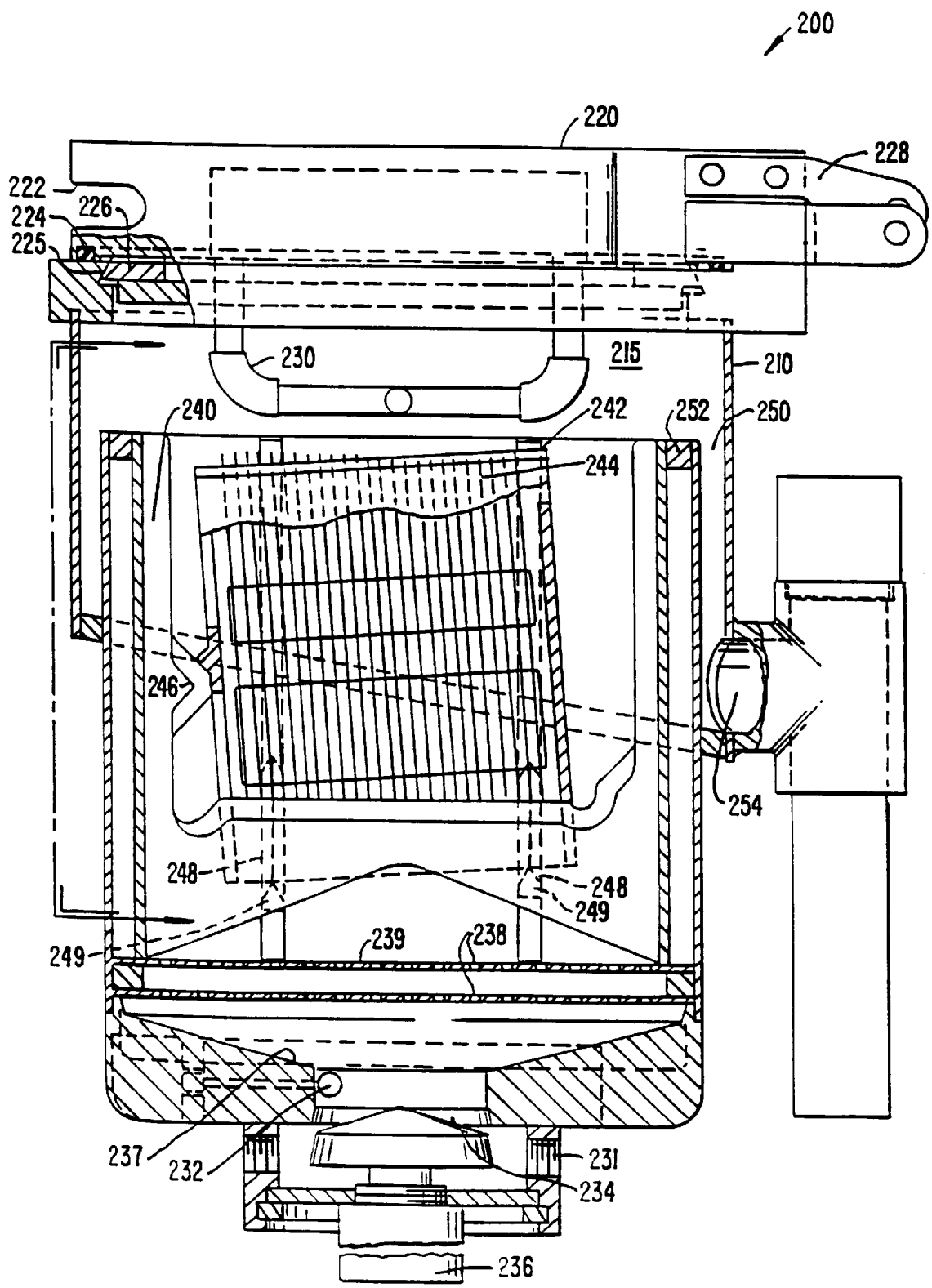
FIG. 4 is a simplified cross-sectional side-view of an embodiment of the cleaning chamber according to the present invention.

FIG. 4 is a simplified cross-sectional side-view 200 embodiment of the cleaning chamber according to the present invention. The side-view embodiment 200 includes a main chamber 210, a lid 220, a lower drain region 231, and other elements. The main chamber 210 includes the process region 240 (or lower chamber region) and upper chamber region 215. A cascade drain region 250 also is shown. Of course, other chamber elements also may be present depending upon the particular application.

The lid 220 is preferably a sealed lid. The sealed lid includes a handle 222, O-ring type seal 224, a compression ring 226, a hinge 228, a gas inlet 230, among other features. The compression ring 226 provides outward force onto a horizontal portion 225 of the main chamber housing to seal the contents of the main chamber. The O-ring type seal 224 provides a horizontal seal between vertical surfaces of the lid and main chamber housing. The gas inlet 230 includes at least a carrier gas inlet and solvent gas inlet. Of course, the exact configuration of the gas inlet depends upon the particular application.

The process region 240 includes a substrate carrier 242, substrate carrier support 246, 248, and substrate support 249. As will be described in greater detail below, the substrate carrier and substrate support are configured and arranged to minimize liquid accumulation as liquid is drained away in the drying process.

In a specific embodiment, the substrate carrier is a wafer boat or alternatively a half wafer boat or any other type of substrate carrier with a lower profile. The half wafer boat or lower profile boat holds or accumulates less liquid than its full boat counterpart, and therefore drains liquid faster and more easily. The carrier includes substrates (e.g., wafers) 244 disposed within the supports of the carrier. The carrier is supported by a side substrate carrier support 246 and bottom substrate carrier support 248. The side substrate carrier support holds the substrate carrier in place, and prevents such substrate carrier from excessive movement. As shown, the bottom substrate support tilts the substrate carrier in a slight angle from a horizontal position. The angle tends to prevent substrates from sticking to each other during certain rinse and dry operations. The angle from the horizontal position ranges from about 2° to about 15°, and is preferably determined by the characteristics of the particular carrier. By keeping each of the substrates separated, liquid does not accumulate therebetween, thereby decreasing the amount of liquid and therefore particles from accumulating on the substrate.

Each substrate carrier support includes a contact point on the substrate carrier to drain liquid such as water from the substrate carrier surface. The contact point is typically a knife edge, serrated edge, or any other shape that breaks the surface tension of the liquid on the substrate carrier surface. By breaking the surface tension of the liquid on the substrate carrier, the liquid with particles drains (or "wicks") off of the substrate carrier more easily. Removing the liquid with particles from the substrate carrier tends to promote drying and rinsing of each of the substrates in a particle free manner.

The substrate support 249 provides lift and a contact point to each of the substrates 244 within the substrate carrier. To more easily appreciate the features of the substrate support, it should be noted that each of the substrates in a conventional substrate carrier touches the substrate carrier in at least three large regions. Each of the substrates is also relatively close to the insides of the substrate carrier. Accordingly, liquid easily accumulates and is often trapped on edges of each of the substrates.

To reduce this effect, the substrate support lifts the substrates in the substrate carrier by elevating each of the substrates in the carrier with a knife edge. By lifting each of the substrates in the substrate carrier, the substrate edges are further away from insides of the carrier, thereby allowing liquid to flow free from the region between the substrate edges and carrier insides. To further promote the removal of liquid from each of the substrates, the knife edge is preferably pointed, serrated, or any other shape that easily breaks the surface tension of the liquid at the bottom of each substrate. By breaking the surface tension of liquid at the substrate bottom edges, liquid flows free from the substrate bottom edges, thereby reducing the meniscus at such edges. The knife edge lifts each of the substrates at least 2 mm from the bottom insides of the carrier, and preferably lifts each of the substrates about 5 mm, but no more than about 20 mm. The substrate carrier support removes liquid such as water from the substrates, thereby decreasing the amount of water and in particular the particles in the water.

To add and drain liquid into the main chamber, and in particular the process region, the lower drain region 231 includes a fill inlet 232 and drain valve 236. The fill inlet provides liquid such as DI water and the like into the process region. The drain valve 236 removes liquid from the process region through the drain outlet 236. A plurality of drain holes 238 also exist at the bottom of the main chamber in the process region to distribute the liquid evenly therethrough. The lower drain region also includes an angled drain floor 237 at the bottom of the main chamber to facilitate liquid transfer, and a flat support surface 239 in the process region to support the substrate carrier support.

A cascade region 250 allows liquid to cascade out into cascade drain region 253. To rinse certain chemicals from the substrate carrier and substrates, ultra-purified DI water enters through the fill inlet 237, rises through the drain holes 238, flows through the process region 240, and cascades over a partition 252 into the cascade drain region 253. This sequence of steps removes excess chemicals such as acids or the like from the substrate carrier and substrates, and also keeps such chemicals from accumulating in the main chamber and in particular the process region.

Figure 5:
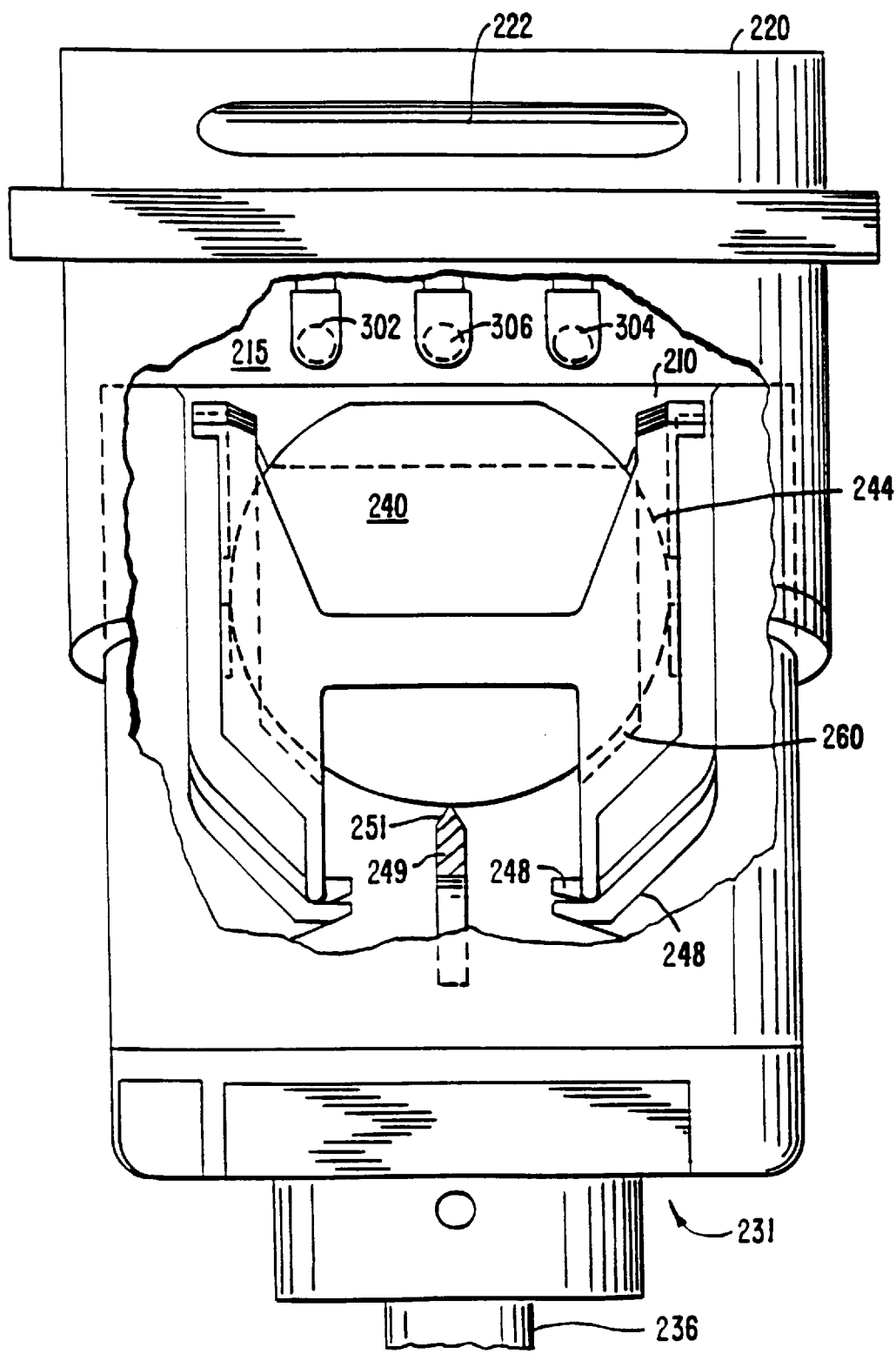
FIG. 5 is a simplified cross-sectional front-view of an embodiment of the cleaning chamber according to the present invention.

FIG. 5 illustrates a simplified front view of the cleaning chamber according to the present invention. For easy reading, FIG. 5 uses some of the same reference numerals as the previous Fig. embodiment. The front-view embodiment shows elements such as the main chamber 210, the lid 220, the lower drain region 231, the process region 240, among others. The main chamber 210 includes the process region 240 and upper chamber region 215.

As shown, the substrate support 249 lifts each of the substrates from the substrate carrier to form a gap 260 between substrate edges and substrate carrier insides. The gap prevents liquid from accumulating between such substrate edges and substrate carrier insides. The gap is no greater than about 20 mm, but is larger than about 2 mm. The substrate support is a knife edge with triangular point 251. Other shapes may also be used to break the meniscus at the bottom of the substrate edges and remove water therefrom. The meniscus often forms at the bottom substrate and surface edges as liquid is being removed from the substrates. As previously noted, the meniscus often contains particles, often detrimental to the manufacture of an integrated circuit.

The front view also shows the substrate carrier supports 248. As shown, each of the substrate carrier support is arranged with different heights, typically lower to higher from one side of the process region to the other side of the process region. The different heights of the substrate carrier support tilt the position of the substrate carrier from horizontal. The tilt or angle of the substrate carrier also tilts the substrates, thereby preventing such substrates from sticking to each other during certain rinse and dry operations.

The front view further shows certain gas inlets 302, 304, and 306. Each of the gas inlets is a distribution plenum with a plurality of holes for distributing gas evenly over the process region. The embodiment includes two outside gas inlets 302 and 304, and a center carrier gas inlet 306. The two outside gas 302, 304 inlets generally introduce an ultra-pure non-reactive (e.g., non-oxidizing, non-reactive, inert, etc.) gas into the cleaning chamber. In some embodiments, the two outside gas inlets provide ultra-pure nitrogen to purge the main chamber from the environment, thereby creating an ultra-clean main process region, e.g., substantially free from particles. In these embodiments, the nitrogen gas (or absence of oxygen gas) is necessary or even critical to prevent the formation of oxidation on the substrate, e.g., semiconductor wafer, etc. The center gas inlet introduces the carrier gas comprising the cleaning enhancement substance. The non-reactive gas (or nitrogen) mixes with the carrier gas comprising cleaning enhancement substance in the cleaning chamber. By way of the ultra-pure non-reactive gas and carrier gas, the chamber is substantially free from particles greater than about 0.2 microns, and is preferably substantially free from particles greater than about 0.1 microns, thereby creating an ultra-pure and ultra-clean environment. Of course, the number of inlets and their use depend upon the particular application.

Figure 6:
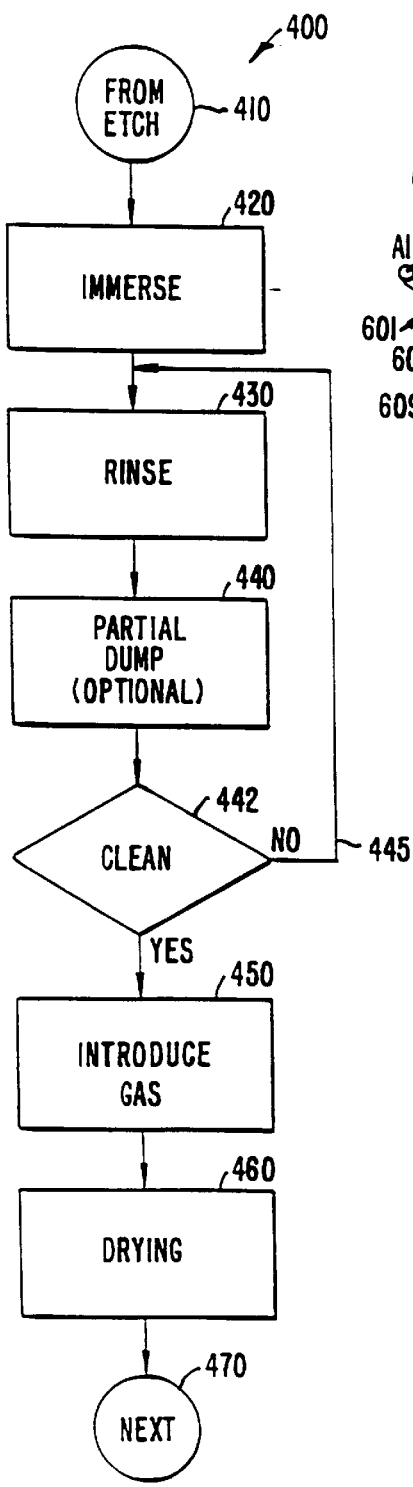
FIG. 6 is a simplified flow diagram of an embodiment of the cleaning method according to the present invention.

FIG. 6 is a simplified flow diagram 400 of an embodiment of a cleaning method according to the present invention. The rinse method is illustrated as a cleaning method for a recently wet etched substrate. The wet etched substrate for illustrative purposes is etched in a solution of hydrofluoric acid (HF) or buffered hydrofluoric acid (BHF). Hydrofluoric acid is often used to remove oxides from surfaces of a semiconductor wafer. As merely an example, this embodiment should not be taken as limiting the scope of the present invention.

The flow diagram begins 400 by receiving a recently etched substrate (etched wafer) 410 from the BHF etch. The etched substrate has no oxide layer thereon from the BHF etch, and is predominately hydrophobic in characteristic. A step 420 of immersing the etched substrate in the bath of ultra-purified DI water follows. The etched substrate is immersed into the DI water from the acid bath in about 5.0 seconds or less, and preferably about 2.5 seconds and less.

The step of immersing the etched substrate immediately into the DI water substantially prevents formation of silicon dioxide from the oxygen in air, and promotes the formation of a thin but clean high grade silicon dioxide layer from the ultra-purified DI water. The DI water is substantially free from particles and therefore forms a substantially particle free silicon dioxide layer. The DI water can be at room temperature (e.g., 20° C.) or an elevated temperature, e.g., 25° C., 30° C., 40° C., 45° C., etc.

To remove acid such as the HF from the surface of the substrate, the ultra-purified DI water in the main chamber (or vessel) flows across the substrate and cascades over into a drain. The DI water cascade carries excess acid into the drain and reduces the acid concentration in the vessel.

Optionally, the DI water in the vessel may be removed by dumping it (step 440) into a bottom drain dump. Preferably, the dumping step is a partial dump, and not a complete dump or removal of DI water. During the removal of the DI water, an ultra-pure gas (non-reactive) replaces the DI water. A typical gas includes filtered nitrogen and others. The filtered gas also is ultra-clean, e.g., substantially free from particles.

After replacing the DI water with the clean gas, clean DI water from the DI water source flows into the main chamber to cover the surface area of the substrate. These aforementioned steps may be repeated (branch 445) alone or in any combination until substantially no residual acid exists (test 442) on the substrate.

When residual acid has been substantially removed from the substrate, a carrier gas, including a cleaning enhancement substance (e.g., trace amount of polar organic compound, helium, carbon dioxide, etc.), is introduced (step 450), and mixes with ultra-pure non-reactive gas and replaces the DI water. In one embodiment, the trace of polar organic compound in the gases includes a concentration ranging from about 1,000 ppm and less to about 500 ppm and less. The polar organic compound also can be at other concentrations, but is generally not saturated or superheated. The carrier gas is preferably ultra-pure nitrogen with a trace of polar organic compound such as isopropyl alcohol, di-acetone alcohol, 1-methoxy-2-propanol, and others. The carrier gas is also substantially free from particles of about 0.20 microns to about 0.15 microns, and is preferably free from particles of about 0.10 microns or less. For a typical batch of substrates in a conventional substrate boat, the amount of polar organic compound used is preferably less than a milliliter.

The trace of polar organic compound is made by bubbling carrier gas into a liquid solution of polar organic compound. In particular, the polar organic compound is made by flowing cold or hot nitrogen through a solution of polar organic compound at a rate of about 3 cubic feet/min. or less. The carrier gas comprising the polar organic compound then mixes with either cold nitrogen at a flow rate of about 5 cubic feet/min. and less, or hot nitrogen at a flow rate of about 10 cubic feet/min. and less. A temperature of such hot nitrogen carrier gas is at about 70° F. and higher but not greater than 250° F., and is preferably about 185° F. and less. By mixing nitrogen gas with the carrier gas comprising the polar organic compound, the polar organic compound is substantially dilute (or a non-saturated vapor) in the main chamber.

The mixed carrier gas, including the polar organic compound and non-reactive gas, comes in contact with the attached DI water on the wafer, which is being drained off at a slow rate. This tends to remove particles from such substrate. A carrier gas, including isopropyl alcohol, 1-methoxy-2-propanol, di-acetone alcohol, or other polar organic solvents mixed with non-reactive gas, replaces the DI water at a rate of about 4 mm/second or less as measured from the substrate face, and is preferably at a rate of about 1 mm/second and less.

The trace of polar organic compound is believed to remove a substantial portion of the liquid on the substrate surface through a concentration gradient or mass transfer effect, e.g., Marongoni flow. This effect tends to increase the flow of liquid from the substrate surface through use of a solvent or any cleaning enhancement substance, but does not remove all liquid from the substrate surface. It is generally believed that the trace of polar organic compound in the gas changes the angle of the liquid meniscus on the substrate face to reduce surface tension of the liquid attached to the substrate face, thereby increasing fluid flow therefrom. It is also generally believed that the trace amount of the polar organic compound dopes the liquid attached to the substrate face to cause a concentration gradient of the polar organic compound in the attached liquid to accelerate fluid flow of the attached liquid off of the substrate face. In particular, the polar organic compound forms a concentration gradient along a boundary layer of liquid attached to the substrate surface, which facilitates the fluid flow therefrom. This fluid flow pulls or draws off any particles from the substrate face. These particles are less than about 0.5 microns in diameter or preferably 0.2 microns in diameter or more preferably 0.1 microns in diameter. Preferably, the carrier gas also is not heated but is at room temperature, e.g., 18° C. to 22.5° C.

In certain embodiments, a thin boundary layer of liquid still remains on the substrate face after liquid is removed from the chamber. This boundary layer often ranges from about 1,000 Å and less, and is preferably 500 to about 50 A, and is more preferably at about 100 Å and less. In one embodiment using isopropyl alcohol as the polar organic compound, the boundary layer is about 500 A and less. In an embodiment using 1-methoxy-2-propanol, the boundary layer is about 100 Å and less. A further drying step can be used to evaporate such boundary layer.

In alternative embodiments, the gas (i.e., ultra-pure gas) is substantially free from any polar organic compounds, organic compounds, or the like. Like the previous embodiments, the gas replaces the DI water (step 450) being drained, removing water from the surface of the substrate, and also tends remove particles from such substrate via the DI water. The gas replaces the DI water at a rate of about 2.50 mm/second or less as measured from the substrate face, and is preferably at a rate of about 1.25 mm/second and less, and is more preferably at a rate of about 0.60 mm/second or less. In such embodiments, the present invention uses substantially no harmful solvents or the like, and is therefore even more safe, efficient, and economical.

A step of drying (step 460) is performed on the substrate and carrier for further drying, if necessary. The step of drying substantially removes all liquid droplets adhering to surfaces such as substrate edges, carrier edges, and the like. In one embodiment, drying occurs by pulse flow drying.

Figure 7:
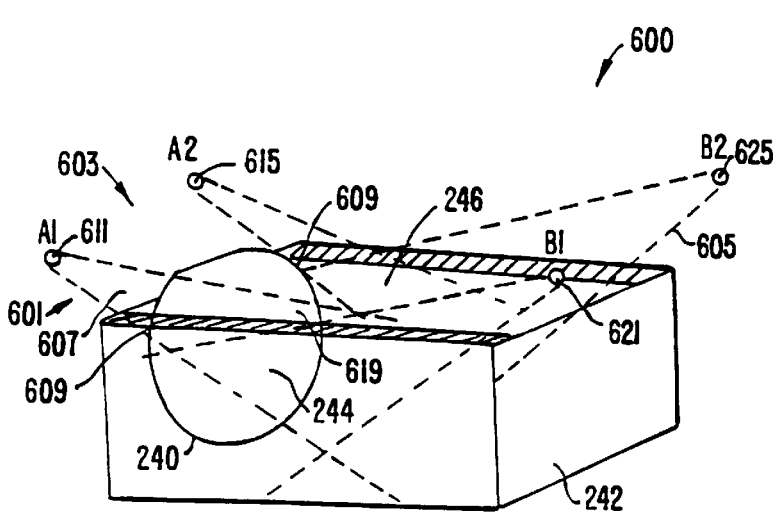
FIG. 7 is a simplified diagram of a high velocity flow apparatus according to the present invention.
Figure 7A:
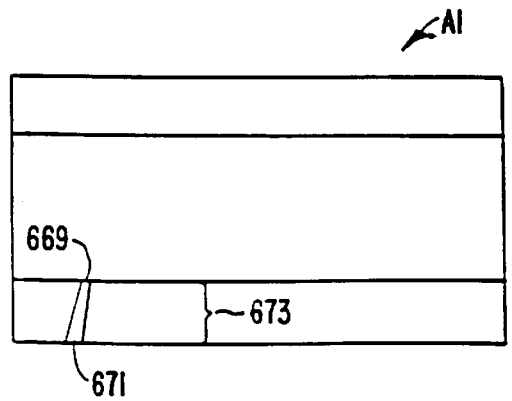
FIGS. 7A and 7B illustrate simplified diagrams of a nozzle configuration according to the present invention.
Figure 7B:
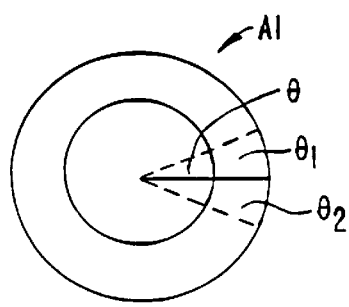

The step of pulse flow drying occurs by way of high velocity flow apparatus 600 illustrated in FIGS. 7, 7A, and 7B. The high velocity flow apparatus can be adapted into the present rinse chamber 200 among other systems. The high velocity flow apparatus includes a plurality of nozzles 601 directed over a substrate carrier 242. The substrate carrier 242 includes a plurality of substrates 244, each having residual amounts of liquid at their edges. Each substrate may have a liquid volume ranging from about 1.0 milliliter to about 0.2 milliliter but is preferably less than about 0.5 milliliter. The plurality of nozzles 601 is defined by a first set of nozzles 603 (first nozzle set), a second set of nozzles 605 (second nozzle set), and others.

The first nozzle set 603 is directed to the front side 607 of the substrates 244. The first nozzle set directs drying fluid at substrate edges 609 adjacent to the substrate carrier sides 246. The drying fluid can be any suitable fluid capable of removing liquid from the substrate edges and substrate surfaces. The drying fluid is preferably ultra-pure nitrogen and the like, but may also be a variety of other gases or gaseous mixtures. The first nozzle set preferably includes at least two nozzles, each placed at a location to direct drying fluid towards the substrate edges 609 adjacent to the substrate carrier sides. In the first nozzle set, a first nozzle A1 611 is directed to the substrate edges 609 at one side of the substrate carrier, and a second nozzle A2 615 is directed to the substrate edges 609 at the other side of the substrate carrier.

The second nozzle set 605 is directed to the back side 619 of the substrates 244. The second nozzle set directs drying fluid at substrate edges 609 adjacent to the substrate carrier sides 246. The second nozzle set preferably includes at least two nozzles, each placed at a location to direct drying fluid towards the substrate edges adjacent to the substrate carrier sides. In the second nozzle set, a first nozzle Bi 621 is directed to the substrate edges at one side of the substrate carrier, and a second nozzle B2 625 is directed to the substrate edges at the other side of the substrate carrier.

The nozzle can be any suitable nozzle capable of enabling the drying fluid to flow over the substrate edges and remove liquid therefrom. Nozzle A1 includes an opening 669 having a width of about 0.025 inch and a height of about 0.375 inch 673 as illustrated in FIGS. 7A and 7B. As shown, FIG. 7A illustrates a simplified cross-sectional side view of the nozzle, and FIG. 7B illustrates a simplified cross-sectional front view of the nozzle. The nozzle opening 671 includes an angle $\theta$ ranging from about 20 degrees to about 80 degrees, but is preferably about 75 degrees and less. The angle $\theta$ may also be defined by a first angle $\theta_1$ and second angle $\theta_2$. The first angle may be different from the second angle but can also be the same. Of course, other flow rates, pressures, and nozzle dimensions can be used depending upon the particular application.

Each nozzle is positioned to direct drying fluid to the substrate edges and portions of the substrate surface. The nozzle is directed to an inner edge of the substrate carrier to promote the removal of liquid between the substrate edges and the carrier sides. The nozzle is defined between about 0.5 inch to about 2 inches from an outside edge of the substrate carrier. The nozzle is placed at an angle from about 5° to about 85°, and is preferably about 45° from a line perpendicular from the substrate surface. Of course, the exact angle used depends upon the particular application.

Drying occurs by directing drying fluid from the first nozzle set and the second nozzle set in an alternating sequence against the substrate edges and portions of the substrate surfaces. For example, the first nozzle set sends a pulse of drying fluid against the substrate edges and portions of the front substrate surfaces, then the second nozzle set sends a pulse of drying fluid from the opposite direction against the substrate edges and portions of the back substrate surface. The drying fluid pulses from the first nozzle set and the second nozzle set alternate until no more liquid remains on the substrate edges.

In removing water from the substrate edges, the second nozzle set has a pulse duration which is longer than the pulse duration of the first nozzle set. Water adheres on the backside of the substrate and substrate edges on a conventional semiconductor wafer with a greater attractive force than the front-side of the substrate. Accordingly, it is often preferable to have a pulse duration at the second nozzle set which is at least two times longer than the pulse duration at the first nozzle set. The pulse duration at the second nozzle set can also be three times longer or more than the pulse duration at the first nozzle set. The pulse duration for the first nozzle set ranges from about 1 to 3 seconds and greater, and the pulse duration for the second nozzle set ranges from about 2 to 6 seconds and greater. The number of pulses is preferably greater than 5 for each substrate side for a total of about 30 seconds of total pulsing time. Of course, other selected pulses among the first and second nozzle sets may also be performed, depending upon the particular application. A further discussion of these nozzles can be found in application Ser. No. 08/555,634.

Optionally, pulse flow drying is followed by flowing hot nitrogen gas over the substrate carrier (step 470). The hot nitrogen gas is ultra-pure nitrogen gas with a temperature at about 70° F. and is preferably greater than 150° F., but no greater than 200° F. The combination of hot nitrogen and pulse flow drying reduces actual drying time by about one half, as compared to drying solely by means of hot nitrogen and the like. Alternatively, a drying gas such as nitrogen can be used alone to dry the wafer. Of course, other carrier gases and combinations thereof may also be used depending upon the particular application.

Another method to rinse and dry HF etched substrate includes a selected sequence of the aforementioned steps. A solution of HF etches silicon dioxide off the semiconductor substrate. To stop etching, the substrate is quickly immersed into ultra-pure DI water in a vessel. After immersing the etched substrate into the DI water, the vessel is purged with filtered nitrogen gas. The nitrogen gas flows at a rate of ranging from about 1 cubic feet/min. to about 10 cubic feet/min., and is preferably at about 2 cubic feet/min.

To further rinse and remove acid from the substrate, DI water flows past the substrate and cascades from a top portion of the vessel into a drain to cascade rinse the substrate. A quick dump follows the cascade rinse. Preferably, the quick dump occurs at a rate where the liquid level drops at a rate greater than about 20 mm/sec. as measured from a substrate face. During the quick dump, clean nitrogen gas replaces the DI water, thereby preventing any oxidation of the substrate from air. Clean DI water fills the vessel and replaces the nitrogen to reimmerse the substrate in the DI water.

A combination of a carrier gas, including a cleaning enhancement substance, mixed with ultra-pure non-reactive gas then slowly replaces the DI water to remove substantially all acid off the substrate. The slow replacement step substantially eliminates any water from the substrate edges (a meniscus). After another sequence of quick DI water fills and partial dumps, another gaseous mixture, including carrier gas and cleaning enhancement substance, replaces the DI water. Substantially, all water is removed from the substrate at this time. The cleaning enhancement substance reduces the surface tension of the liquid on the substrate to enhance fluid flow therefrom. During removal of the liquid, it pulls particles off the substrate surfaces, thereby cleaning the substrate. To further dry the substrate and carrier, warm or hot nitrogen is pulsed into the vessel. The nitrogen includes a temperature ranging from about 70° F. to about 250° F.

As previously noted, alternative embodiments use a gas without any polar organic compound or the like to replace the DI water. In such embodiments, the gas replaces the DI water at a rate of about 2.50 mm/second or less as measured from the substrate face, and preferably at a rate of about 1.25 mm/second and less, and more preferably at a rate of about 0.80 mm/second or less. The gas without any polar organic compounds or the like may also be nitrogen at a temperature ranging from about 70° F. to about 250° F. To further dry the substrate and carrier, warm or hot nitrogen is pulsed into the vessel. The nitrogen includes a temperature ranging from about 70° F. to about 250° F.

The aforementioned methods also include the use of a certain substrate support and a substrate carrier support to enhance wicking or to draw liquid away from the substrate and carrier. For example, the substrate support includes a knife edge that lifts the substrates to prevent accumulation of water at the substrate edges, and in particular the substrate bottom edges. The substrate carrier support wicks or draws the water from the surface of the substrate carrier, and also puts a slight tilt from horizontal on such carrier.

The slight tilt of the substrate carrier also tilts the substrates, which tends to prevent them from sticking to each other. As previously noted, sticking substrates often accumulate water therebetween. The accumulation of water also accumulates particles, which may be in the water. By removing the water and particles from the substrate, the present method provides higher device yields on a typical semiconductor substrate.

In addition, the aforementioned cleaning method occurs without movement of the substrate. In fact, the substrate carrier remains substantially stationary after being immersed, and during the drying, cascade rinse, and other steps. By way of less movement, the system has fewer mechanical parts and is often easier to use and maintain than certain prior art systems.

Moreover, the amount of polar organic compound used for each batch of substrates is typically less than a fraction of a milliliter. The use of less organic compounds is often advantageous to the highly flammable prior art methods of drying a substrate by way of IPA for example. In certain embodiments, no polar organic compounds or the like are used. Accordingly, the present method is less hazardous than certain prior art methods to both health and environment.

The aforementioned embodiments also are used in other selected semiconductor fabrication process steps. In one embodiment, the cleaning technique occurs in pre-gate oxide cleans. Pre-gate oxide cleans were generally not performed due to the sensitivity of gate oxide layer formation. That is, convention pre-gate oxide cleans were not performed due to the introduction of particles onto the semiconductor substrate. The present technique, however, actually removes any particles that may remain on the surfaces of the substrate before gate oxide layer formation, thereby improving the general quality of the gate oxide layer. The present technique removes substantially all particles greater than about 0.5 microns, and preferably 0.2 microns, and more preferably 0.1 microns.

In an alternative specific embodiment, the present cleaning technique can be applied before other semiconductor process applications. These process applications are described in great detail in a text written by Stanley Wolf and Richard N. Tauber, Semiconductor Processing For The VLSI Era, Vol. 1: Process Technology (1986) (herein "WOLF"). For example, the present technique is applied as a pre-epitaxial, pre-diffusion, pre-metal, pre-poly, pre-implant, pre-photoresist, and pre-stack oxide cleaning techniques. Generally, the present cleaning technique can be applied at room temperature with trace quantities of polar organic compound. The trace quantity of polar organic compound at room temperature does not generally detrimentally influence the semiconductor or photoresists. As noted in the background of invention, photoresists often dissolve during high temperature processing using solvents. As also previously noted, the present technique actually removes particles, rather than introducing them.

In an alternative embodiment, the present cleaning technique can be applied after performing a selected semiconductor fabrication process. An example of this fabrication process includes nitride deposition, polish cleans (e.g., CMP), buffered oxide etches, and metal deposition. These process steps also are described in great detail in a text written by WOLF. Additional applications of the present cleaning technique also can be applied for hydrofluoric acid last recipes and critical metal oxide silicon etches. As previously noted, the present technique actually removes particles from the semiconductor, rather being another process that introduces them.

Figure 8:
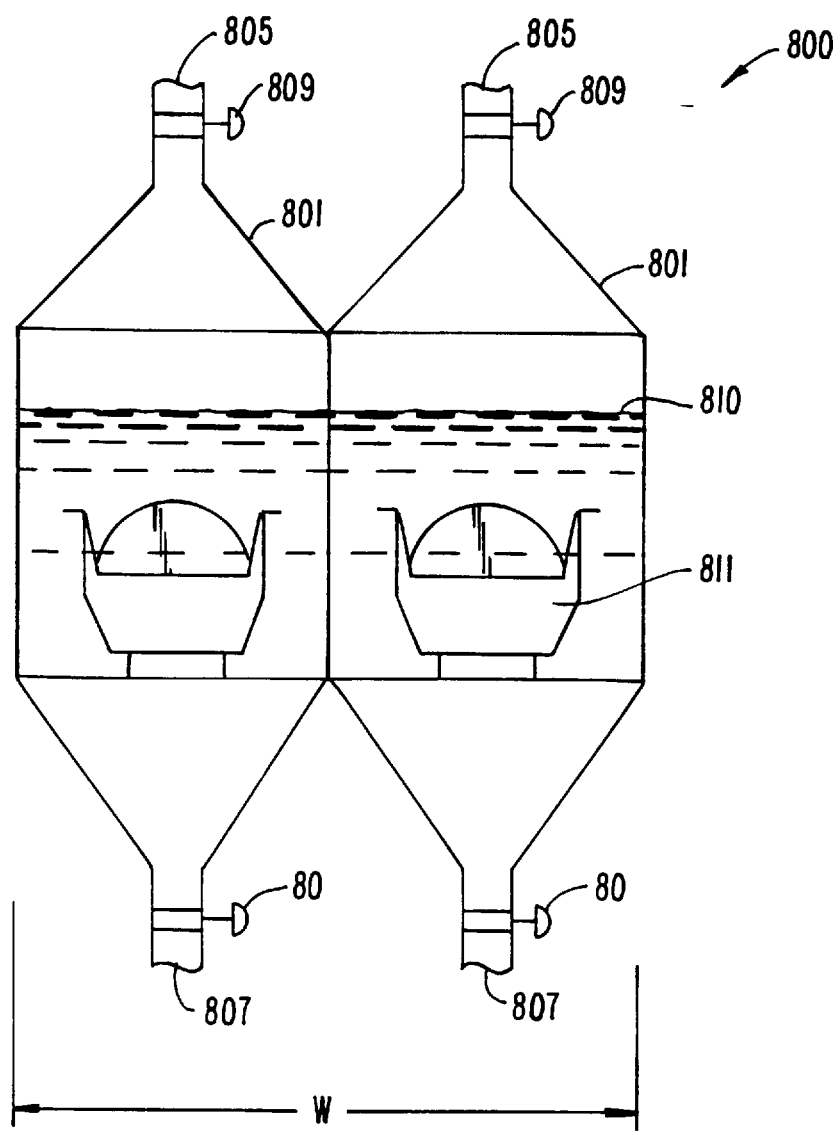
FIGS. 8 and 9 are simplified diagrams of other chamber configurations according to the present invention.

FIG. 8 is a simplified diagram of a rinsing and drying apparatus 800 according to the present invention. This apparatus is merely an illustration and should not limit the scope of the claims herein.

The apparatus 800 includes a plurality of chambers 801, occupying a relative small width (W). The width ranges from about thirty-six inches and less, thirty inches and less, twenty-four inches and less, twenty inches and less, and eighteen inches and less. This width allows this present apparatus to replace a conventional dryer such as a spin/rinse dryer, without substantial modifications to the facility.

As merely an example, each chamber is sealed and has an inlet 805 and an outlet 807. Fluid such as a liquid or gas (preferably saturated or superheated solvent such as alcohol and the like) enters the inlet, which is controlled by a control valve 809. Another control valve 807 selectively adjusts the liquid level 810 for draining liquid. In one aspect of the invention, liquid such as water flows into the chamber 801 and immerses a carrier 811 comprising one or more wafers. This liquid tends to remove any residual acids and the like. A gas which is preferably a saturated solvent such as alcohol enters the inlet and displaces the liquid to dry the wafer. In most embodiments, each chamber can run independently from each other, thereby allowing flexibility in operation. Of course, the operation of this system will depend upon the application.

Figure 9:
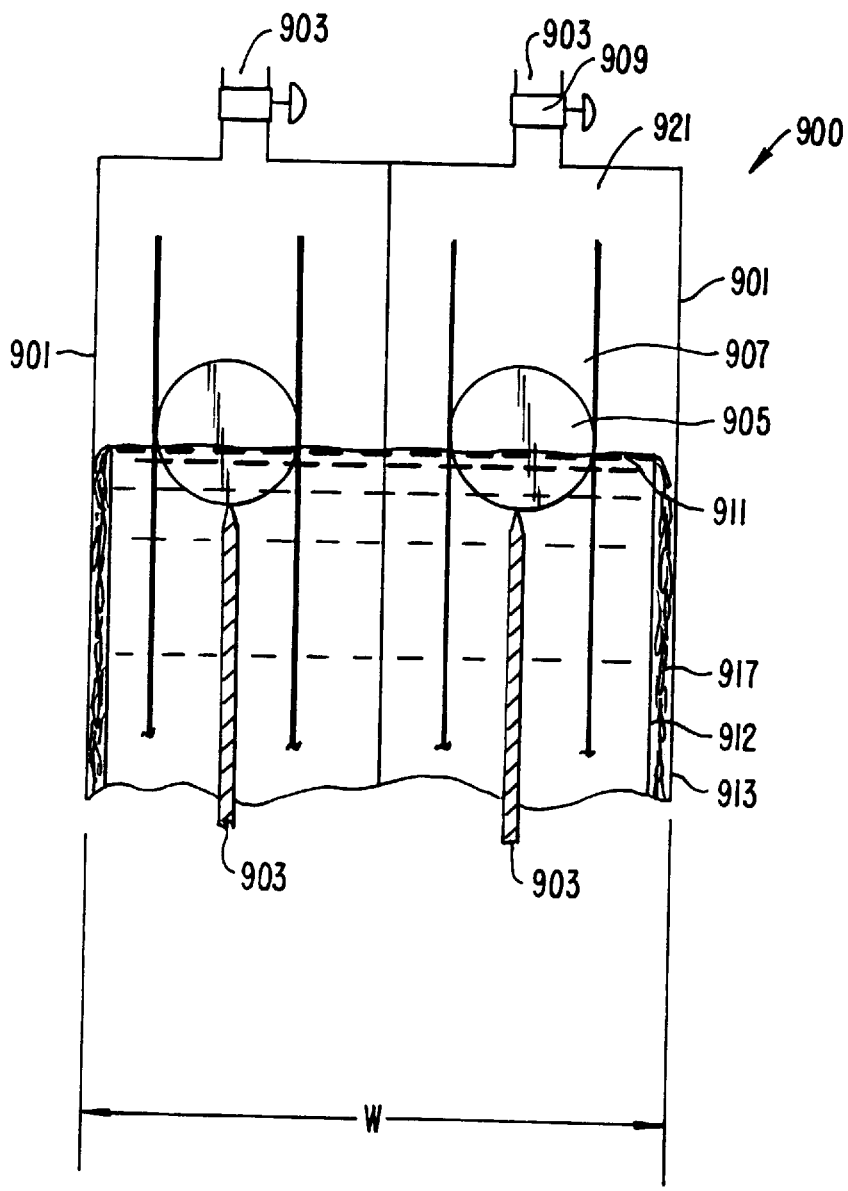

FIG. 9 is a simplified diagram of an alternative embodiment of a rinsing and drying apparatus 900 according to the present invention. This apparatus is merely an illustration and should not limit the scope of the claims herein.

The apparatus 900 includes a plurality of chambers 901, occupying a relative small width (W). The width ranges from about thirty-six inches and less, thirty inches and less, twenty-four inches and less, twenty inches and less, and eighteen inches and less. This width allows this present apparatus to replace a conventional dryer such as a spin/rinse dryer, without substantial modifications to the facility.

As merely an example, each chamber 901 includes an inlet 903 and an outlet (not shown). The inlet 903 is controlled by a control valve 909, which introduces a gas. This gas can be any of those gases mentioned in the previous embodiments. Liquid such as water flows into an inner tank 912 and cascades out 917 into a liquid drain region 913, which removes the liquid from the inner tank 912. This ensures that particulate contamination does not remain on the surface of the liquid, since a lifting device 903 pushes a wafer with a support 907 into the gas 921 for the purpose of drying the wafer. The wafer can be in a carrier or the like. Similar to the previous embodiments, each chamber can run independently from each other, thereby allowing flexibility in operation. Of course, other methods of operation can be performed depending upon the application.

Figure 10:
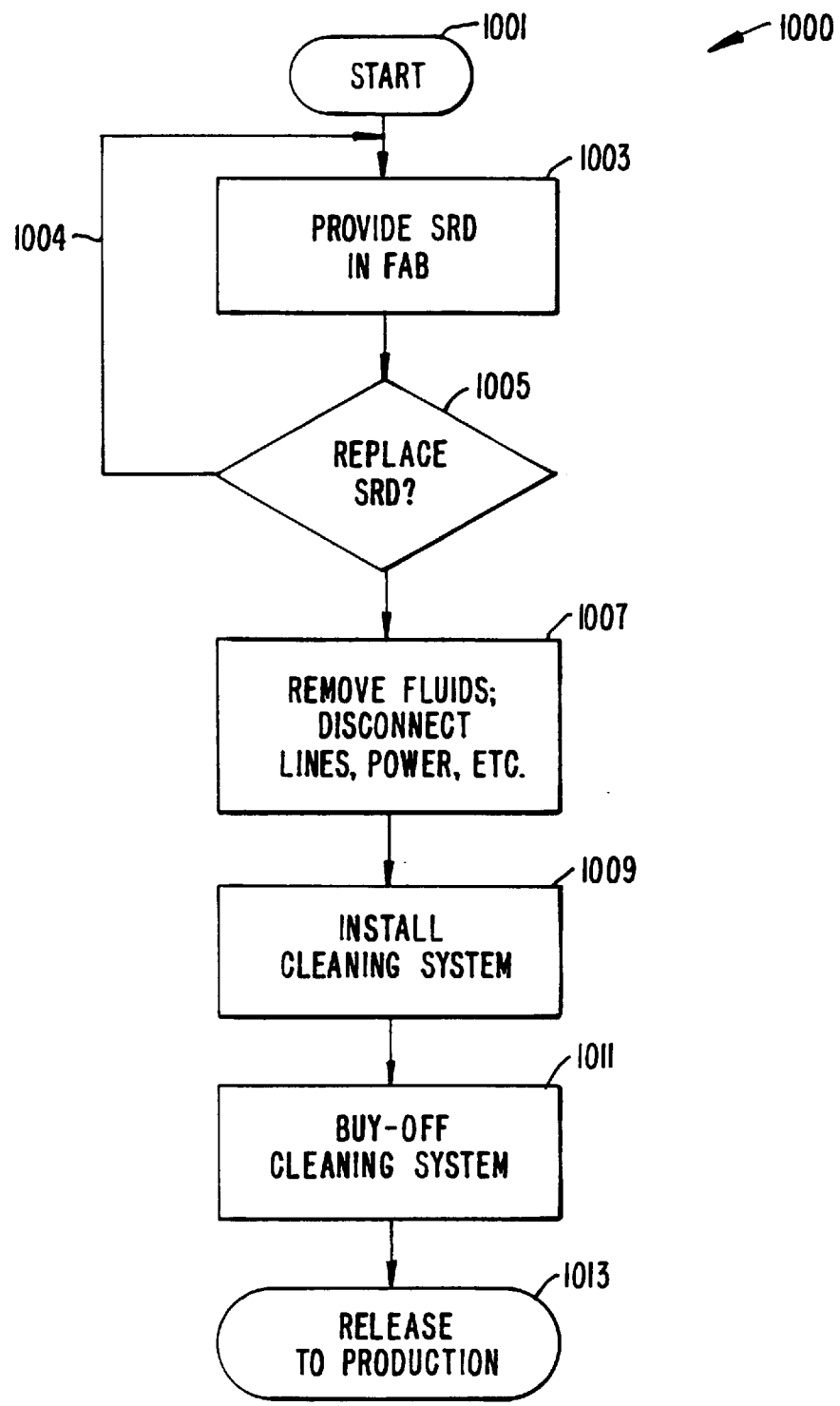
FIG. 10 is a simplified flow diagram of a technique for replacing a conventional drying apparatus with a cleaning system according to the present invention.

Moreover, the present invention provides a method for installing the cleaning system as shown by the simplified flow diagram 1000 of FIG. 10. This flow diagram 1000 is merely an illustration and should not limit the scope of the claims herein. One of ordinary skill in the art would recognize other variations, alternatives, and modifications.

The flow diagram 1000 begins at step 1001. A pre-existing fabrication facility for semiconductor integrated circuits is provided. This preexisting facility includes at least one spin rinse/dryer (SRD) 1003. As noted above, this dryer is extremely problematic and would need to be replaced 1005 periodically. The conventional SRD, however, occupies a relatively small footprint and cannot be replaced by different equipment, which has a much larger footprint. An example of this footprint includes a width of about thirty-six inches and less, thirty inches and less, twenty-four inches and less, twenty-inches and less, and eighteen inches and less. A length for the footprint ranges from about seventy-two inches and less or sixty-inches and less. Otherwise, this dryer is not replaced and continues to operate in a limited manner via branch 1004.

If the SRD is replaced, fluids are removed from any chambers and power lines and fluid lines are disconnected 1007. A maintenance technician or engineer physically removes the SRD from the fabrication facility, leaving a vacant region of floor space.

A cleaning system according to the present invention is installed into the vacant floor space. In particular, the cleaning system is physically placed on the vacant floor space. Facility lines such as water, drain, etc. are provided to the cleaning system. These facility lines preferably include DI water (e.g., 18 Megaohm resistance or the like), exhaust, clean dry air (CDA), nitrogen, and a drain line. Power is also provided to the cleaning system. Preferably, power is supplied using 208 Volt, 50 Hz, 30 Amp; single phase power.

The method then provides a "buy-off" step 1013 to confirm the correct operation of the system using a variety of processing sequences. Once the system proves to comply with these processing sequences, it is then released to production 1013. Of course, other sequences could be used depending upon the application.

While the above is a full description of the specific embodiments, various modifications, alternative constructions, and equivalents may be used. For example, while the description above is in terms of a method and apparatus for semiconductor substrates, it would be possible to implement the present invention to the manufacture of raw wafers, disks and heads, flat panel displays, microelectronic masks, and other applications requiring high purity wet processing such as steps of rinsing, drying, cleaning, and the like. In addition, the systems of the above Figs. are in terms of a cleaning system for semiconductors. A skilled artisan may, alteratively, employ such systems to other industries such as electro-chemical, pharmaceutical, printed circuit board, optical devices, and any other industry that needs an improved technique to rinse and dry an article of manufacture. Furthermore, the apparatus of the above Figs. are in terms of the present cleaning system, but also can be employed in any other cleaning system, drying system, rinse system, or the like. Moreover, many of the embodiments above can be combined or separated, depending upon the application Therefore, the above description and illustrations should not be taken as limiting the scope of the present invention which is defined by the appended claims.

What is claimed is:

1. A method of installing a cleaning apparatus, said method comprising steps of:
   providing a fabrication floor having a used drying unit, said used drying unit operably coupled to power and a plurality of fluid lines, said drying unit occupying a floor space no greater than about thirty-six inches by about seventy-two inches and greater;
   removing said used drying unit from said fabrication floor by disconnecting said power and said plurality of fluid lines; and
   installing a cleaning apparatus onto said floor space no greater than about thirty-six inches by about seventy-two inches, said installing comprising connecting said power and said plurality of fluid lines to said cleaning apparatus, said cleaning apparatus comprising:
   a housing having a width portion no greater than about thirty-six inches and a length portion no greater than about seventy-two inches;
   wherein said housing comprises a plurality of cleaning chambers, at least two of said plurality of chambers being positioned next to each other so that a width of said two chambers is less than about thirty-six inches, each of said cleaning chambers comprising:
      an interior region sufficient for immersing a carrier into a liquid, said carrier comprising at least one wafer disposed therein;
      an inlet operably coupled to said interior region to introduce a gas into said interior region;
      a drain operably coupled to said interior region to remove said liquid from said interior region at a selected rate; and
      a controller operably coupled to said chamber for selectively controlling said selected rate.

2. The method of claim 1 wherein said used drying unit is a spin/rinse dryer.

3. The method of claim 1 wherein said used drying unit processes at least fifty wafers per batch(s).

4. The method of claim 1 wherein said floor space is no greater than twenty-four inches by about seventy-two inches.

5. The method of claim 1 wherein at least one of said fluid lines is provided to supply an ultra-clean water.

6. The method of claim 5 wherein said ultra-clean water is substantially free from particles greater than about 0.1 microns in diameter.

7. The method of claim 1 wherein at least one of said fluid lines is provided to drain fluid.

8. The method of claim 1 wherein said interior region houses a conventional wafer boat having a first dimension and a second dimension, said first dimension being longer than said second dimension.

9. The method of claim 8 wherein said conventional wafer boat is positioned into said interior region wherein said second dimension is parallel to said housing width portion of no greater than thirty-six inches.

10. The method of claim 1 wherein said housing width portion of no greater than thirty-six inches is no greater than a measurement selected from a group consisting of thirty inches and less, twenty-four inches and less, twenty inches and less, and eighteen inches and less.

11. The method of claim 1 wherein said plurality of cleaning chambers are two cleaning chambers.

12. The method of claim 1 wherein said cleaning enhancement substance is a trace of polar organic compound, said trace of polar organic compound being a non-saturated vapor.

13. The method of claim 1 wherein said cleaning enhancement substance is selected from a group consisting of a surfactant, isopropyl alcohol, di-acetone alcohol, helium, carbon dioxide, ammonia, and 1-methoxy-2-propanol.

14. The method of claim 1 wherein said cleaning chamber further comprises a drying source mounted adjacent to said one wafer, said drying source removing any possible amount of said ultra-clean liquid attached to said one wafer.

15. A method of installing a cleaning apparatus on a fabrication floor having a used drying unit, said used drying unit operably coupled to power and a plurality of fluid lines, said drying unit occupying a floor space no greater than about thirty-six inches by about seventy-two inches and greater, said method comprising:
   removing said used drying unit from said fabrication floor by disconnecting said power and said plurality of fluid lines; and
   installing a cleaning apparatus onto said floor space no greater than about thirty-six inches by about seventy-two inches, said installing comprising connecting said power and said plurality of fluid lines to said cleaning apparatus, said cleaning apparatus comprising:
   a housing having a width portion no greater than about thirty-six inches and a length portion no greater than about seventy-two inches;
   wherein said housing comprises a plurality of cleaning chambers, at least two of said plurality of chambers being positioned next to each other so that a width of said two chambers is less than about thirty-six inches, each of said cleaning chambers comprising:
      an interior region sufficient for immersing a carrier into a liquid, said carrier comprising at least one wafer disposed therein;
      an inlet operably coupled to said interior region to introduce a gas into said interior region;
      a drain operably coupled to said interior region to remove said liquid from said interior region at a selected rate; and
      a controller operably coupled to said chamber for selectively controlling said selected rate.

16. The method of claim 15 wherein said used drying unit is a spin/rinse dryer.

17. The method of claim 15 wherein said carrier is a wafer boat, positioned into said interior region, having a first dimension and a second dimension, said first dimension being longer than said second dimension, said second dimension parallel to said housing width portion of no greater than thirty-six inches.

18. The method of claim 15 wherein said housing width portion of no greater than thirty-six inches is no greater than a measurement selected from a group consisting of thirty inches and less, twenty-four inches and less, twenty inches and less, and eighteen inches and less.

19. The method of claim 15 wherein said gas comprises a cleaning enhancement substance, said cleaning enhancement substance being a trace of polar organic compound, said trace of polar organic compound being a non-saturated vapor.

20. The method of claim 19 wherein said cleaning enhancement substance is introduced into said chamber using a device selected from the group consisting of a solvent bubbler, an ultrasonic injector, an ultrasonic transducer, a megasonic injector, and a megasonic transducer.

21. The method of claim 19 wherein said cleaning enhancement substance is selected from a group consisting of a surfactant, isopropyl alcohol, di-acetone alcohol, helium, carbon dioxide, ammonia, and 1-methoxy-2-propanol.

22. The method of claim 15 wherein said each cleaning chamber further comprises a drying source mounted adjacent to said one wafer, said drying source removing any possible amount of said liquid attached to said one wafer.

23. A method of installing a cleaning apparatus, said method comprising:
   providing a fabrication floor having a used drying unit, said used drying unit operably coupled to power and a plurality of fluid lines, said drying unit occupying a floor space no greater than about thirty-six inches by about seventy-two inches and greater;
   removing said used drying unit from said fabrication floor by disconnecting said power and said plurality of fluid lines; and
   installing a cleaning apparatus onto said floor space no greater than about thirty-six inches by about seventy-two inches, said installing comprising connecting said power and said plurality of fluid lines to said cleaning apparatus, said cleaning apparatus comprising:
   a housing having a width portion no greater than about thirty-six inches and a length portion no greater than about seventy-two inches;
   wherein said housing comprises a cleaning chamber, a width of said chamber being less than about thirty-six inches, said cleaning chamber comprising:
      an interior region sufficient for immersing an object into a liquid;
      an inlet operably coupled to said interior region to introduce a gas into said interior region;
      a drain operably coupled to said interior region to remove said liquid from said interior region at a selected rate; and
      a controller operably coupled to said chamber for selectively controlling said selected rate.

24. The method of claim 23 wherein said used drying unit is a spin/rinse dryer.

25. The method of claim 23 wherein said gas comprises a cleaning enhancement substance, said cleaning enhancement substance being a trace of polar organic compound, said trace of polar organic compound being a non-saturated vapor.

26. The method of claim 25 wherein said cleaning enhancement substance is introduced into said chamber using a device selected from the group consisting of a solvent bubbler, an ultrasonic injector, an ultrasonic transducer, a megasonic injector, and a megasonic transducer.

27. The method of claim 23 wherein said housing width portion of no greater than thirty-six inches is no greater than a measurement selected from a group consisting of thirty inches and less, twenty-four inches and less, twenty inches and less, and eighteen inches and less.

28. A method of installing a cleaning apparatus on a fabrication floor having a used drying unit, said used drying unit operably coupled to power and a plurality of fluid lines, said drying unit occupying a floor space no greater than about thirty-six inches by about seventy-two inches and greater, said method comprising:
   removing said used drying unit from said fabrication floor by disconnecting said power and said plurality of fluid lines; and
   installing a cleaning apparatus onto said floor space no greater than about thirty-six inches by about seventy-two inches, said installing comprising connecting said power and said plurality of fluid lines to said cleaning apparatus, said cleaning apparatus comprising:
   a housing having a width portion no greater than about thirty-six inches and a length portion no greater than about seventy-two inches;
   wherein said housing comprises a cleaning chamber, a width of said chamber being less than about thirty-six inches, said cleaning chamber comprising:
      an interior region sufficient for immersing an object into a liquid;
      an inlet operably coupled to said interior region to introduce a gas into said interior region;
      a drain operably coupled to said interior region to remove said liquid from said interior region at a selected rate; and
      a controller operably coupled to said chamber for selectively controlling said selected rate.

29. The method of claim 28 wherein said used drying unit is a spin/rinse dryer.

30. The method of claim 28 wherein said gas comprises a cleaning enhancement substance, said cleaning enhancement substance being a trace of polar organic compound, said trace of polar organic compound being a non-saturated vapor.

31. The method of claim 30 wherein said cleaning enhancement substance is introduced into said chamber using a device selected from the group consisting of a solvent bubbler, an ultrasonic injector, an ultrasonic transducer, a megasonic injector, and a megasonic transducer.

32. A method of installing a cleaning apparatus on a fabrication floor having a spin/rinse dryer, said spin/rinse dryer operably coupled to power and a plurality of fluid lines, said spin/rinse dryer occupying a floor space no greater than about thirty-six inches by about seventy-two inches and greater, said method comprising:
   removing said spin/rinse dryer from said fabrication floor by disconnecting said power and said plurality of fluid lines; and
   installing a cleaning apparatus onto said floor space no greater than about thirty-six inches by about seventy-two inches, said installing comprising connecting said power and said plurality of fluid lines to said cleaning apparatus, said cleaning apparatus comprising:
   a housing having a width portion no greater than about thirty-six inches and a length portion no greater than about seventy-two inches;
   wherein said housing comprises a cleaning chamber, a width of said chamber being less than about thirty-six inches, said cleaning chamber comprising:
      an interior region sufficient for immersing an object into a liquid;
      an inlet operably coupled to said interior region to introduce a gas into said interior region;

a drain operably coupled to said interior region to remove said liquid from said interior region at a selected rate; and a controller operably. coupled to said chamber for selectively controlling said selected rate.

33. The method of claim 32 wherein said gas comprises a cleaning enhancement substance, said cleaning enhancement substance being a trace of polar organic compound, said trace of polar organic compound being a non-saturated vapor.

34. The method of claim 33 wherein said cleaning enhancement substance is introduced into said chamber using a device selected from the group consisting of a solvent bubbler, an ultrasonic injector, an ultrasonic transducer, a megasonic injector, and a megasonic transducer.

35. The method of claim 32 wherein said housing width portion of no greater than thirty-six inches is no greater than a measurement selected from a group consisting of thirty inches and less, twenty-four inches and less, twenty inches and less, and eighteen inches and less.

36. A method of installing a cleaning apparatus, said method comprising:

providing a fabrication floor having a spin/rinse dryer, said spin/rinse dryer operably coupled to power and a plurality of fluid lines, said drying unit occupying a floor space no greater than about thirty-six inches by about seventy-two inches and greater;

removing said spin/rinse dryer from said fabrication floor by disconnecting said power and said plurality of fluid lines; and installing a cleaning apparatus onto said floor space no greater than about thirty-six inches by about seventy-two inches, said installing comprising connecting said power and said plurality of fluid lines to said cleaning apparatus, said cleaning apparatus comprising:

a housing having a width portion no greater than about thirty-six inches and a length portion no greater than about seventy-two inches;

wherein said housing comprises a cleaning chamber, a width of said chamber being less than about thirty-six inches, said cleaning chamber comprising:

an interior region sufficient for immersing an object into a liquid;

an inlet operably coupled to said interior region to introduce a gas into said interior region;

a drain operably coupled to said interior region to remove said liquid from said interior region at a selected rate; and a controller operably coupled to said chamber for selectively controlling said selected rate.

37. The method of claim 36 wherein said gas comprises a cleaning enhancement substance, said cleaning enhancement substance being a trace of polar organic compound, said trace of polar organic compound being a non-saturated vapor.

38. The method of claim 37 wherein said cleaning enhancement substance is introduced into said chamber using a device selected from the group consisting of a solvent bubbler, an ultrasonic injector, an ultrasonic transducer, a megasonic injector, and a megasonic transducer.

39. The method of claim 36 wherein said housing width portion of no greater than thirty-six inches is no greater than a measurement selected from a group consisting of thirty inches and less, twenty-four inches and less, twenty inches and less, and eighteen inches and less.

* * * * *